United States Patent [19]
Yahata et al.

[11] Patent Number: 5,963,483
[45] Date of Patent: Oct. 5, 1999

[54] SYNCHRONOUS MEMORY UNIT

[75] Inventors: Hideharu Yahata, Inagi; Kenichi Fukui, Kodaira; Yoji Nishio, Hitachi; Atsushi Hiraishi, Kodaira; Sadayuki Morita, Higashiyamato, all of Japan

[73] Assignee: Hitachi, Ltd., Tokyo, Japan

[21] Appl. No.: 09/133,952

[22] Filed: Aug. 14, 1998

[30] Foreign Application Priority Data

Aug. 28, 1997 [JP] Japan ................................ 9-232053

[51] Int. Cl.⁶ ...................................................... G11C 7/00
[52] U.S. Cl. ........................................ 365/189.05; 365/233
[58] Field of Search ............................ 365/189.05, 233, 365/189.02, 230.03

[56] References Cited

U.S. PATENT DOCUMENTS

| | | | |
|---|---|---|---|
| 5,086,414 | 2/1992 | Nambu et al. | 365/230.08 |
| 5,341,341 | 8/1994 | Fukuzo | 365/233 |
| 5,631,866 | 5/1997 | Oka et al. | 365/189.05 |
| 5,661,693 | 8/1997 | Akioka et al. | 365/233 |

FOREIGN PATENT DOCUMENTS

| | | |
|---|---|---|
| 401021786A | 1/1989 | Japan . |
| 1-204292 | 8/1989 | Japan . |
| 3-122895 | 5/1991 | Japan . |
| 4-85792 | 3/1992 | Japan . |
| 4-358392 | 12/1992 | Japan . |
| 9223393 | 8/1997 | Japan . |
| 9251774 | 9/1997 | Japan . |

*Primary Examiner*—Son Mai
*Attorney, Agent, or Firm*—Antonelli, Terry, Stout & Kraus, LLP

[57] ABSTRACT

A synchronous memory unit which includes a plurality of input buffers for receiving address data, a plurality of input latches for holding and outputting address data from in the input buffers according to a clock signal, a plurality of decoders for decoding the address data from the input latches, and a memory cell array having a plurality of memory cells which store and output data signals via bit lines according to the address data decoded by the decoders. Also provided are a sense amplifier for amplifying the output data signals on the bit lines, a selector for selecting one of the amplified output data signals according to the address data decoded by the decoders, and a selector output latch for holding and outputting the amplified output data signal from the selector according to the clock signal. An output latch holds and outputs the amplified output data signal from the selector output latch according to the clock signal. An output buffer receives and outputs the amplified output data signal from the output latch. Each latch includes a first latch for holding and outputting a data signal according to the clock signal, a first switch connected to the first latch for allowing a data signal to pass to the first latch according to the clock signal, and a second latch for holding and outputting a data signal according to the clock signal, and a second switch, connected between the first and second latches, for allowing a data signal to pass from the first latch to the second latch according to the clock signal.

38 Claims, 14 Drawing Sheets

SYNCHRONOUS MEMORY UNIT

BACKGROUND OF THE INVENTION

The present invention relates to a memory unit. More particularly, the present invention relates to a memory unit for synchronously performing the reading and writing of data by loading a latch used for performing the synchronous read and write of data at a particular location in the sequence of circuit elements and a latch circuit.

FIG. 13 illustrates an example of the conventional apparatus. The conventional apparatus includes an X address input buffer 174 for receiving X address data 172, a Y address input buffer 175 for receiving Y address data 173, and X and Y address input latches 176 and 177, respectively, for taking in and outputting the address data held in the input buffers 174, 175 by use of a first clock signal (CLK1). X and Y predecoders 178 and 179 and X and Y decoders 180 and 181 are provided for decoding the address data from the input latches 176, 177, and X and Y decoder latches 182 and 183 are provided for taking in and outputting the address data from the decoders 180 and 181 by use of a second clock signal (CLK2).

A memory cell array 184 is provided having a predetermined plurality of memory cells in which write data are written via the bit lines. Data held in a predetermined plurality of memory cells are output via bit lines according to the outputs of the X and Y decoder latches 182 and 183. A sense amplifier 185 amplifies a predetermined plurality of output data signals through the bit lines, and a selector 186 selects one data from the plurality of data in the sense amplifier 185 according to the output of the Y decoder latch 183. An output latch 187 is provided for taking in and outputting the data from the selector 186 by use of a third clock signal (CLK3), and an output buffer 188 is provided for holding and outputting the data from the output latch 187.

An input buffer 192 receives write data 190, and a write data input latch 194 takes in and outputs the write data 190 held in the input buffer 192 by use of CLK1. A write data latch 196 takes in and outputs the write data from the write data input latch 194 by use of CLK2. A write circuit 198 writes the data from the write data latch 196 in the memory cells of the memory cell array 184 according to the output of the Y decoder latch 183.

An input buffer 193 receives a control signal 191 and a control signal input latch 195 takes in and outputs the control signal held in the input buffer 193 by use of CLK1. A control signal latch 197 takes in and outputs the control signal from the control signal input latch 195 by use of CLK2, and a read/write control circuit 199 receives the control signal from the control signal latch 197 and outputs signals for controlling the write circuit 198 and the sense amplifier 185. A CLK generating circuit 200 generates the first through third clock signals (CLK1, CLK2, CLK3) fed to the respective latches based on an external clock signal.

FIG. 14 illustrates a simplified flow of address, data and clock signals in the conventional apparatus illustrated in FIG. 13. First, an address is held in an address latch 203 via the input buffer 202. When CLK1 is input to the address latch 203, the address is output from the address latch 203, decoded by the predecoder 204 and the decoder 205, and held in the decoder latch 206. When CLK2 is input to the decoder latch 206, the decoded address is output and a memory cell 207 is selected according to the decoded data. Data is output from the selected memory cell 207 and amplified by the sense amplifier 208. One data out of the amplified data is selected by the selector 209 and held in the output data latch 210. When CLK3 is input to the output data latch 210, data is output outside the chip via the output buffer 211.

FIG. 15 illustrates operating waveforms which exist at the time of performing a reading operation in the conventional apparatus. When an address is received from outside the chip, first the address is held in the address latch 203 via the input buffer 202. Subsequently, CLK1 is input to the address latch 203 at time t1 after the input of the first external clock signal (1st). The address data is output, and the output is held in the decoder latch 206 at time ta. Further, CLK2 is input to the decoder latch 206 at time t2 after the input of the second external clock signal (2nd), and an address decode signal is output. A word line is selected based on the output, and the data is read from the memory cell 207 and amplified by the sense amplifier 208. Then one data is selected by the selector 209 and the data thus selected is held in the output latch 210. The time required during this time is tb.

Lastly, CLK3 is input to the output latch 210 at time t3 after the input of the third external clock signal (3rd), and output data is output. The output data is output from the chip via the output buffer 211 at time tc after time t3. At this time, t3+tc=tack (clock access time). In order to ensure the aforesaid operation, moreover, inequalities t1+ta<tcycle (cycle time)+t2, t2+tb<tcycle+t3 have to be satisfied.

FIG. 16 illustrates operating waveforms which occurs at the time of performing a writing operation in the conventional apparatus. When write data is received from outside the chip, first the write data 190 is held in the write data input latch 194 via the input buffer 192. Subsequently, CLK1 is input to the write data input latch 194 at time t1w after the inputting of the first external clock signal (1st), the write data is output, and the output is held in the write data latch 196 at time taw. Further, CLK2 is input to the write data latch 196 at time t2w after the inputting of the second external clock signal (2nd), and the write data is output. The output is input to the write circuit 198 and written in the memory cell 184 according to the X and Y addresses. The time required during this time is tbw. Consequently, the write time tw is tw=tcycle+t2w+tbw. In order to ensure the aforesaid operation, an equality t1w+taw<tcycle+t2w has to be satisfied.

The above-described circuit of the conventional apparatus is disclosed, for example, in Japanese Patent Laid-Open No. 21786/1989.

The cycle time of the synchronous memory unit is generally restricted by a maximum delay time between the input latch for holding data such as the address signal and the chip selection signal and the output latch for outputting the data. Thus the cycle time cannot be made shorter than the time interval. Accordingly, a system for reducing the latch-to-latch delay time by providing an intermediate latch separately from the input and output latches so as to shorten the cycle time has been proposed and employed in the conventional apparatus.

In the conventional apparatus, however, the latches are provided in a portion where the number of signal lines such as word lines is large, and there is a problem that an increase in the number of latch circuits necessarily results in increasing the chip area. In the case of a 2M-bit CMOS cache SRAM (×36), for example, 512 decoder latches are required because there exist 8 X addresses and 8 Y addresses.

Further, in the conventional apparatus two cycles are always needed to write data in a memory cell and consequently the write time cannot be decreased to one-cycle time or less.

SUMMARY OF THE INVENTION

An object of the present invention is to provide a synchronous memory unit which avoids an increase in a chip area resulting from the insertion of latch circuits to shorten the cycle time.

Another object of the present invention is to provide a synchronous memory unit which shortens write time.

Yet another object of the present invention is to provide a latch circuit suitable for use in a synchronous memory circuit where high speed operation is required.

In order to accomplish the above objects the present invention provides a synchronous memory unit wherein a selector output latch is provided between a selector and an output data latch, thereby avoiding the use of the address decoders, write data latches, and control signal latches of the conventional apparatus.

The present invention also accomplishes the above objects by providing a synchronous memory wherein a latch is provided between a selector address decoder and a selector, and a latch is provided between a sense amplifier and the selector, thereby avoiding the use of the address decoders, write data latches, and control signal latches of the conventional apparatus.

The present invention further accomplishes the above objects by providing a synchronous memory unit wherein a latch is provided between a Y address predecoder and a selector address decoder, and a latch is provided between a sense amplifier and the selector, thereby avoiding the use of the address decoders, write data latches, and control signal latches of the conventional apparatus.

More particularly, the present invention provides a first embodiment of a synchronous memory unit which includes X and Y address input buffers for receiving X and Y address data, X and Y address input latches for holding the X and Y address data held in the X and Y address input buffers and outputting the X and Y address data according to a clock signal, X and Y address predecoders and X and Y address decoders for decoding the X and Y address data from the X and Y address input latches, and a memory cell array having a plurality of memory cells which store data signals and output data signals according to the X and Y address data decoded by the decoders. A sense amplifier amplifies the output data signals and a selector selects one amplified output data signal from the amplified output data signals from the sense amplifier according to the Y address data decoded by the Y address predecoder and decoder. A selector output latch holds the amplified output data signal from the selector and outputs the amplified output data signal according to the clock signal. An output latch holds the amplified output data signal from the selector output latch and outputs the amplified output data.

The first embodiment of the synchronous memory unit also includes a write data input buffer and a control signal input buffer for receiving write data and a control signal respectively, a write data input latch connected to the write data input buffer and a control signal input latch connected to the control signal input buffer. The write data input latch holds write data from the write data input buffer and outputs the write data according to the clock signal. The control signal input latch holds the control signal from the control signal input buffer and outputs the control signal according to the clock signal. A read/write circuit receives the control signal from the control signal input latch and generates control signal for controlling a write circuit and the sense amplifier. The write circuit responds to the control signals generated by the read/write control circuit and the decoded Y address data from the Y address decoder so as to write the write data to particular memory cells in the memory cell array. The sense amplifier responds to the control signal generated by the read/write control circuit so as to perform the appropriate operation depending upon whether a read or write operation is being conducted.

In a second embodiment of the synchronous memory unit of the present invention each of the above-described elements of the first embodiment are included with the addition of a selector address latch and a plurality of selector address decoders. The selector address latch is connected to the Y address predecoder and a first selector address decoder is connected to the selector address latch and the selector while a second selector address decoder is connected to the Y address predecoder and the write circuit. In the second embodiment of the present invention depending upon the value of the Y address the Y address decoder can be bypassed in favor of the selector address latch and one of the first or second selector address decoders. Also provided in the second embodiment is a sense amplifier output latch which is connected between the sense amplifier and the selector.

In a third embodiment of the synchronous memory unit of the present invention each of the above-described elements of the second embodiment are included with the addition of a pulse generating circuit which generates a pulse based on a fourth clock signal provided by the clock signal generator and an AND gate which performs a logical operation on the pulse output by the pulse generating circuit and the decoded address output by the first selector address decoder. The output of AND gate is provided as a control signal to the selector.

The present invention also provides an edge trigger type latch circuit suitable for use in a synchronous memory circuit where high speed operation is required. The edge trigger type latch circuit of the present invention can be used for each of the latches of the first through third embodiment of the synchronous memory unit of the present invention.

The edge trigger type latch circuit includes a first latch for holding a data signal and outputting the data signal according to the clock signal, a first switch connected to the first latch for allowing a data signal to pass to the first latch according to the clock signal, and a second latch for holding a data signal and outputting the data signal according to the clock signal. A second switch, connected between the first latch and the second latch, allows a data signal to pass from the first latch to the second latch according to the clock signal.

BRIEF DESCRIPTION OF THE DRAWINGS

The scope of the present invention will be apparent from the following detailed description, when taken in conjunction with the accompanying drawings, and such detailed description and specific examples, while indicating preferred embodiments of the invention, are given by way of illustration only, since various changes and modifications within the spirit and scope of the invention will become apparent to those skilled in the art from this detailed description, in which.

DESCRIPTION OF THE PREFERRED EMBODIMENT

Figure 1:
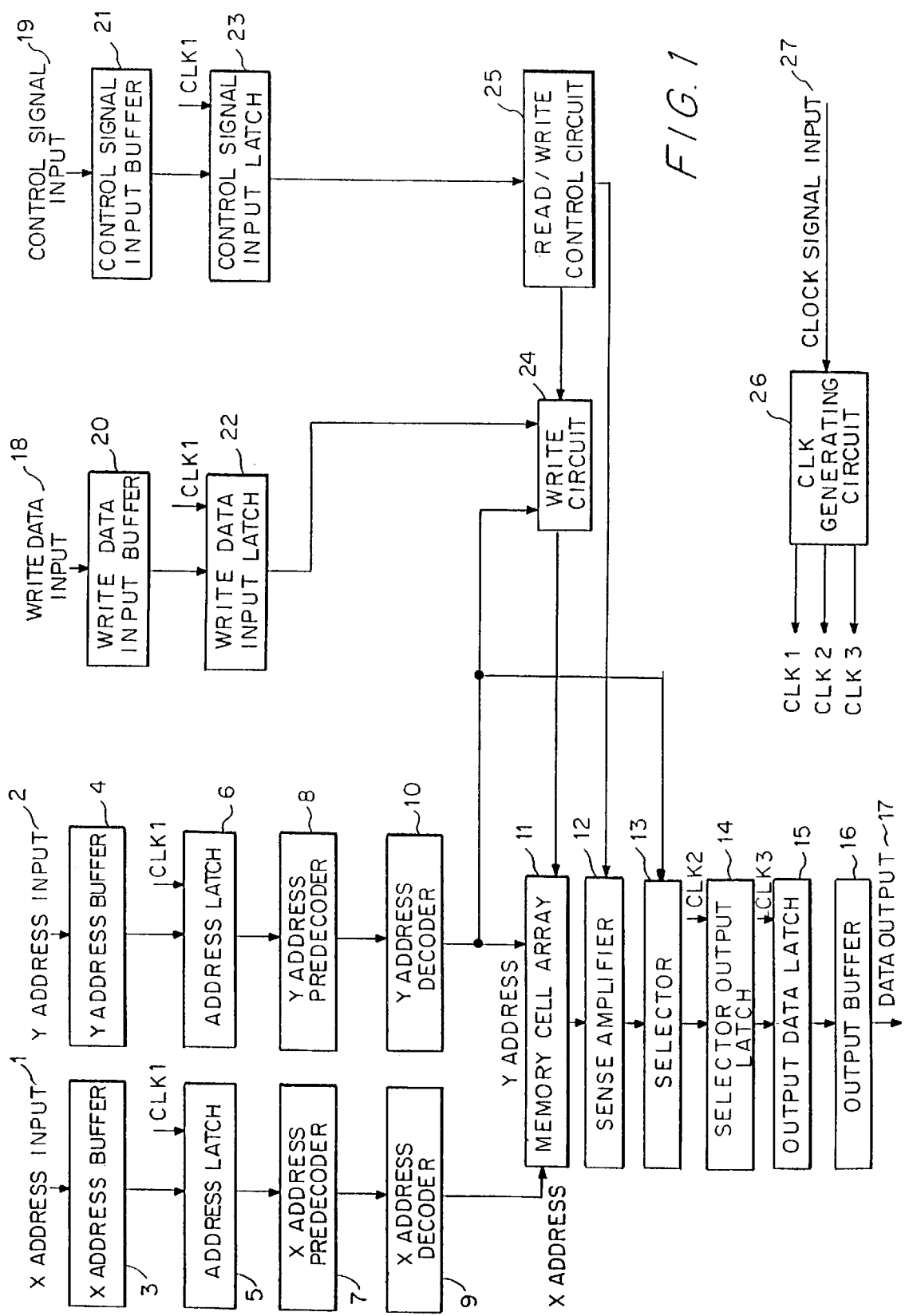
FIG. 1 is a block diagram illustrating a synchronous memory unit of the first embodiment of the present invention.

FIG. 1 illustrates a synchronous memory unit as a first embodiment of the present invention. As illustrated in FIG. 1, the synchronous memory unit includes an X address input buffer 3 for receiving X address data 1, a Y address input buffer 4 for receiving Y address data 2, an X and a Y address input latch, 5 and 6 respectively, for taking in and outputting the address data held in the input buffers by use of a first clock signal (CLK1), and decoders, including X and Y predecoders 7 and 8, and X and Y decoders 9 and 10, for decoding the X and Y address data from the input latches 5 and 6. A memory cell array 11 is provided, having a predetermined plurality of memory cells in which write data are written via the bit lines, for outputting the data held in a predetermined plurality of memory cells via bit lines according to the decoded address data by the X and Y decoders 7–10. A sense amplifier 12 amplifies a predetermined plurality of output data signals through the bit lines. A selector 13 selects one data from the plurality of data in the sense amplifier 12 according to the decoded address data by the Y decoder 10. A selector output latch 14 takes in and outputs data from the selector 13 by use of a second clock signal (CLK2). An output latch 15 takes in and outputs the data from the selector output latch 14 by use of a third clock signal (CLK3). An output buffer 16 holds and outputs the data from the output latch 15.

A write data input buffer 20 receives write data 18, and a write data input latch 22 takes in and outputs the write data held in the write data input buffer 20 by use of CLK1. A write circuit 24 writes the write data from the write data input latch 22 in the memory cell of the memory cell array 11 according to the decoded address data in the Y address decoder 10. A control signal input buffer 21 receives a control signal 19, and a control signal input latch 23 takes in and outputs the control signal held in the control signal input buffer 21 by use of CLK1. A read/write control circuit 25 receives the control signal from the control signal input latch 23 and outputs signals for controlling the write circuit 24 and the sense amplifier 12. A CLK generating circuit 26 generates the clock signals (CLK1, CLK2, CLK3) fed to the respective latches from an external clock signal 27.

With the arrangement described above, only 36 selector and output latch circuits are required whereas 512 decoder latch circuits are required in the conventional apparatus which may be a 2M-bit CMOS cache SRAM (×36). In other words, the number of latch circuits is reduced to about ⅟13. Therefore, it is possible to prevent an increase in the chip area resulting from providing such latch circuits for reducing the cycle time. Also, with the arrangement described above, since the write data latch and the control signal latch that have heretofore been required in the conventional apparatus can be omitted, the number of latch circuits is prevented from increasing. In a 2M-bit CMOS cache SRAM (×36), a total of 37 elements including write data and control signal latch circuits can be omitted as compared with the conventional apparatus.

Figure 2:
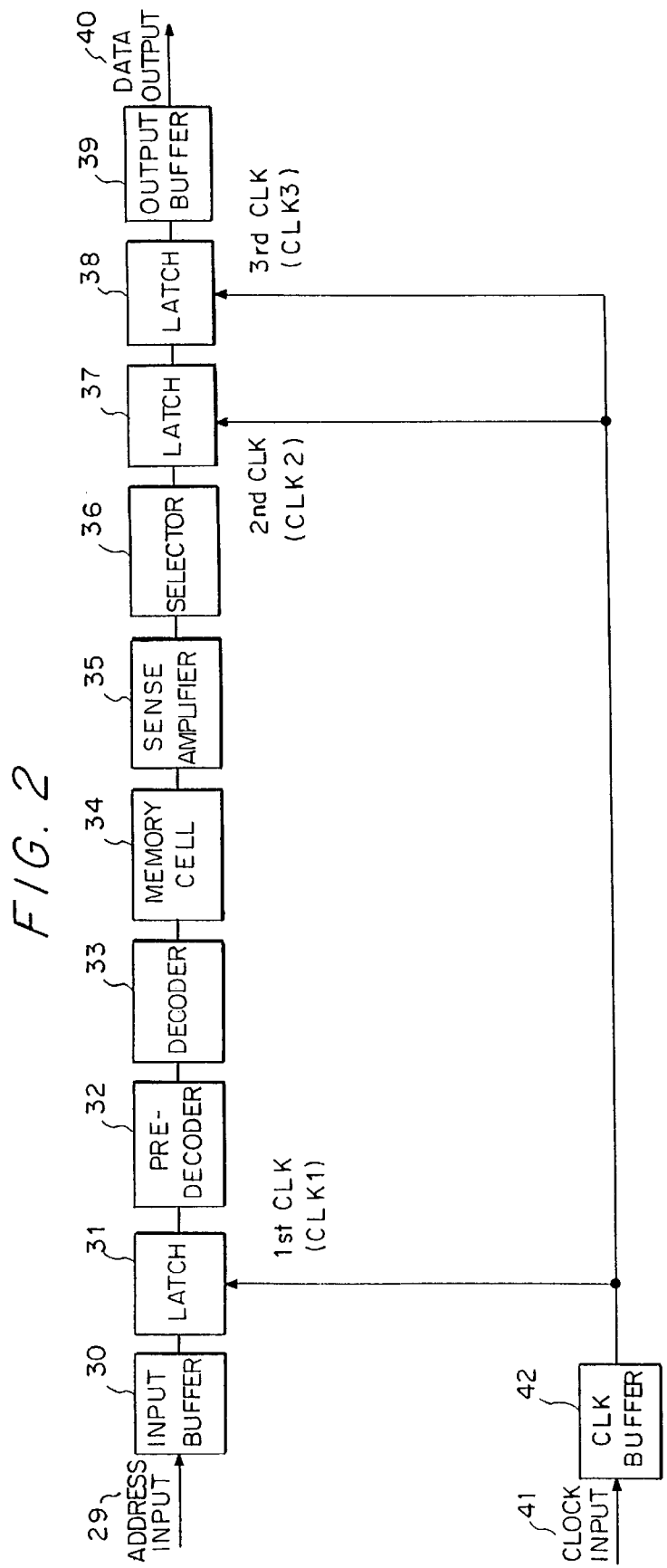
FIG. 2 is a block diagram illustrating the simplified flow of address, data and clock signals in the first embodiment of the present invention.

FIG. 2 illustrates the simplified flow of address, data and clock signals of the first embodiment of the present invention illustrated in FIG. 1. First, an address is held in the address latch 31 via the input buffer 30. When CLK1 is input to the address latch 31 then, the address is output from the latch 31 and decoded by the predecoder 32 and the decoder 33. A memory cell 34 is selected according to the decoded data. Data is output from the selected memory cell 34 and then amplified by the sense amplifier 35. One data out of the amplified data is selected by the selector 36 and held in the selector output latch 37. When CLK2 is input to the selector output latch 37 then, data is output and held in the output data latch 38. Thereafter, when CLK3 is input to the output data latch 38, data 40 is output outside the chip via the output buffer 39.

Figure 3:
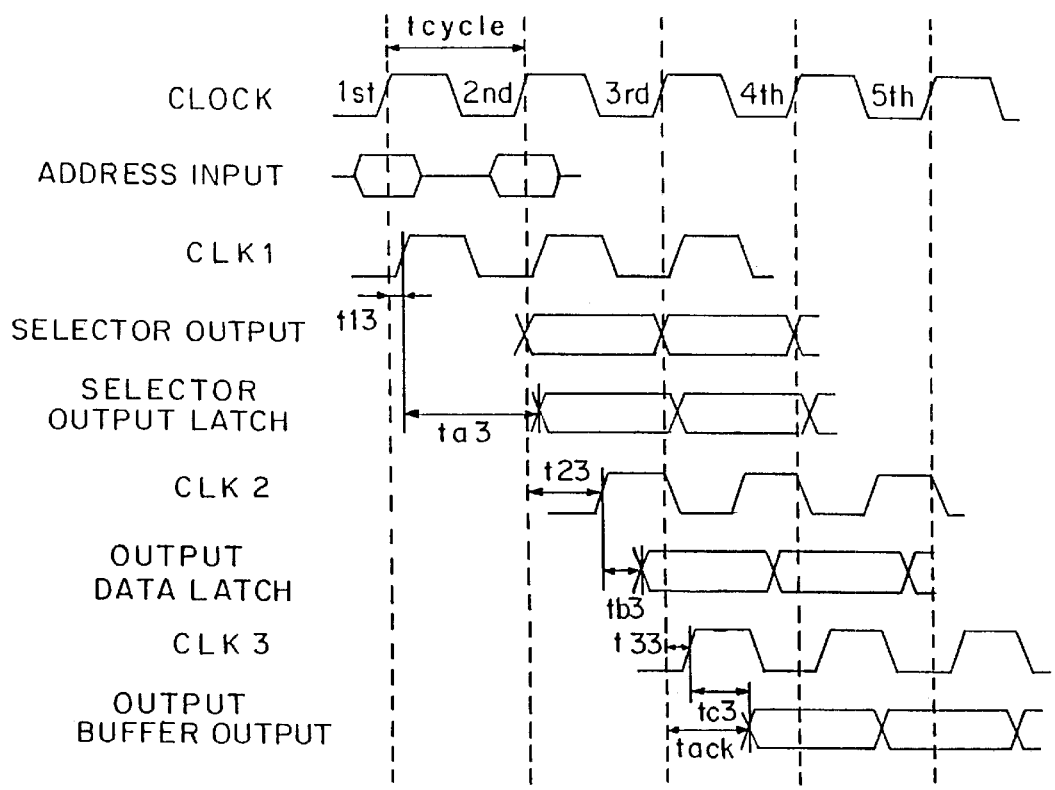
FIG. 3 is a waveform chart at the time of reading in the first embodiment of the present invention.

FIG. 3 illustrates operating waveforms at the time of reading in the first embodiment of the present invention illustrated in FIG. 1. When an address is input from outside the chip, the address is held in the address latch 31 via the input buffer 30. Subsequently, CLK1 is input to the address latch 31 at time t13 after the input of the first external clock signal (1st), and the address data is output. The output is decoded by the predecoder 32 and the decoder 33, a word line is selected according to the decoded data, and data is read from the memory cell 34 and amplified by the sense amplifier 35. Then one data is selected by the selector 36 and the data thus selected is held in the selector output latch 37. The time required during this time is ta3. Further, CLK2 is input to the selector output latch 39 at time t23 after the input of the second external clock signal (2nd). Data is output from the selector output latch 37 and the output is held in the output latch 38 at time tb3. Lastly, CLK3 is input to the output latch 38 at time t33 after the input of the third external clock signal (3rd), and output data is output. The output data is output from the chip via the output buffer 39 at time tc3. At this time, t33+tc3=tack (clock access time). In order to ensure the aforesaid operation, moreover, inequalities t13+ ta3<tcycle+t23, and t23+tb3<tcycle+t33 have to be satisfied. Thus, the data can be output from the chip at the third cycle according to the first embodiment of the present invention illustrated in FIG. 1 like the conventional apparatus.

Figure 4:
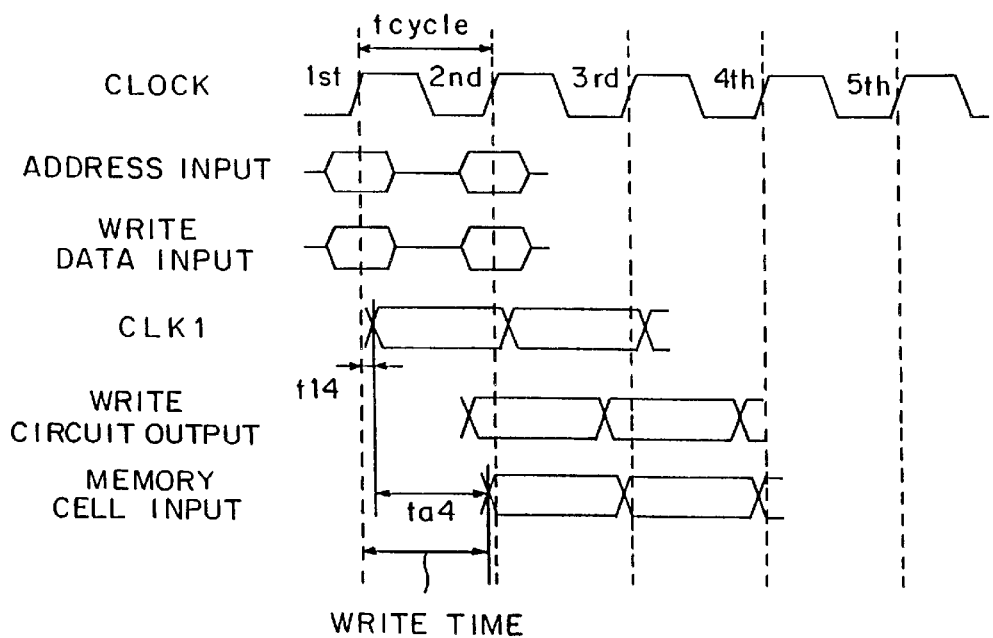
FIG. 4 is a waveform chart at the time of writing in the first embodiment of the present invention.
Figure 16:
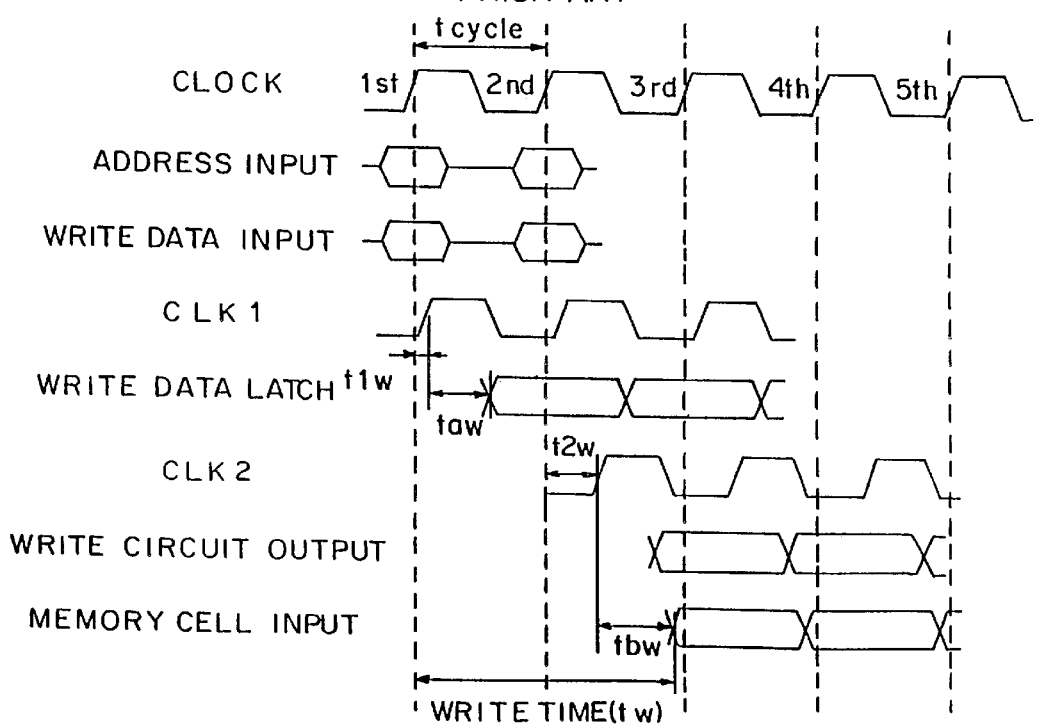
FIG. 16 is a waveform chart at the time of writing in the example of the conventional apparatus.

FIG. 4 illustrates operating waveforms at the time of writing in the first embodiment of the present invention. When write data is input from outside the chip, the write data is held in the write data input latch 22 via the input buffer 20. Subsequently, CLK1 is input to the write data input latch 22 at time t14 after the input of the first external clock signal (1st), and the write data is output. The output is input to the write circuit 24 and written in the memory cell 11 according to the X and Y addresses. The time required during this time is tw4. Consequently, the write time tw4 is t14+ta4. Thus, unlike the conventional apparatus the word line can be selected at the first cycle by not using a decoder latch, and data can be written at the first cycle since the write data is allowed to reach the memory cell at the first cycle by not using the write data latch 22 and the control signal latch 23. Therefore, the write time can be shortened in contrast to the conventional apparatus in which the data is written at the second cycle. In FIG. 16, the write time can be shortened by about ((tcycle−(t1w+taw))+t2w) when t1w+taw<tcycle, whereas it can be shortened by about (t2w−((t1w+taw)−tcycle)) when t1w+taw>tcycle.

Figure 5:
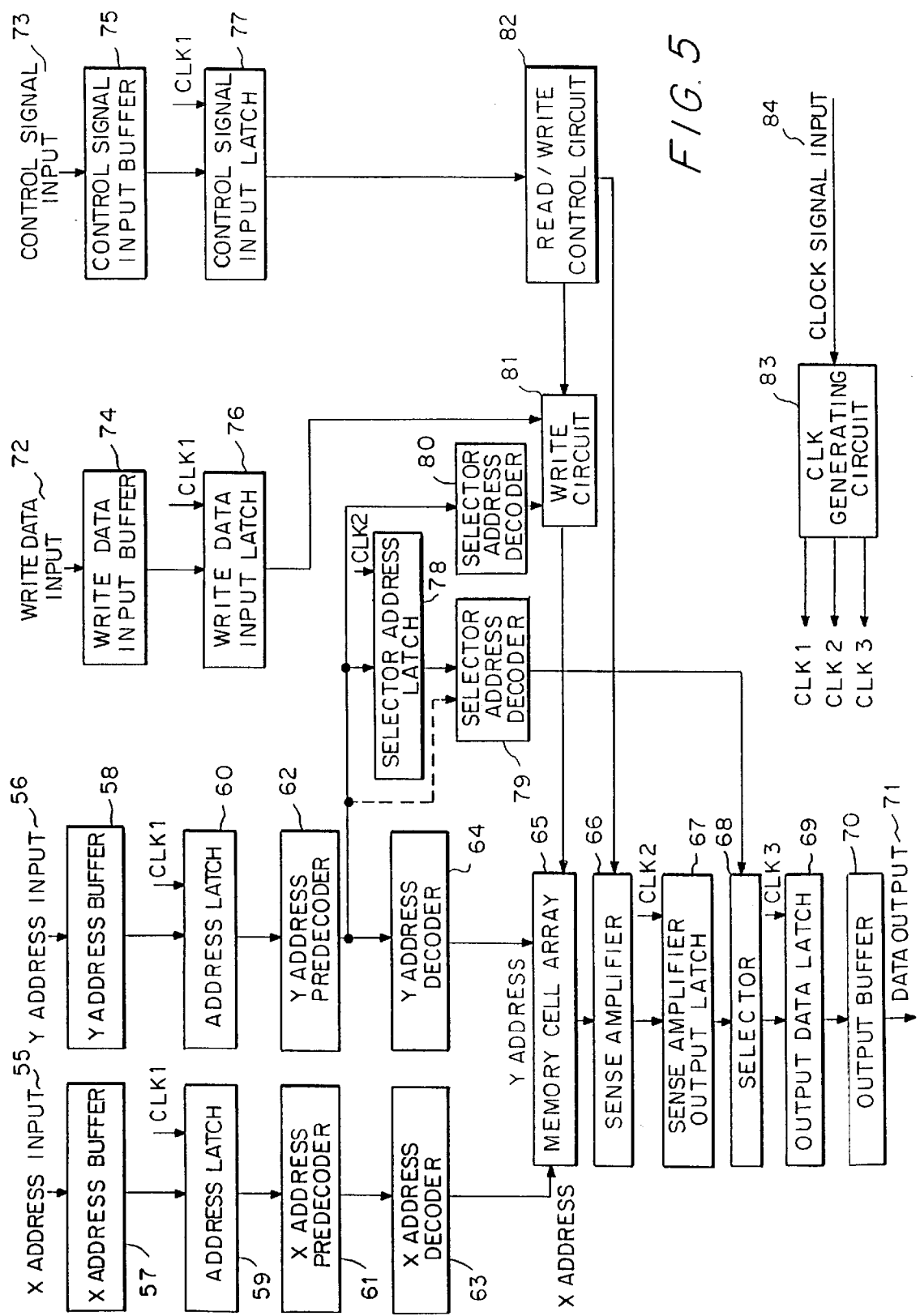
FIG. 5 is a block diagram illustrating a synchronous memory unit of a second embodiment of the present invention.

FIG. 5 illustrates a synchronous memory unit as a second embodiment of the present invention. As illustrated in FIG. 5, the synchronous memory unit includes an X address input buffer 57 for receiving X address data 55, a Y address input buffer 58 for receiving Y address data 56, X and Y address input latches 59 and 60 respectively, for taking in and outputting the address data held in the input buffers 57 and 58 by use of a first clock signal (CLK1), X and Y predecoders 61 and 62 respectively, for predecoding the X and Y address data from the input latches 59 and 60, and X and Y decoders 63 and 64 respectively, for decoding the X and Y predecoded address data from the X and Y predecoders 61 and 62.

A memory cell array 65 is provided having a predetermined plurality of memory cells in which write data are written via the bit lines. The memory cell array 65 outputs the data held in a predetermined plurality of memory cells via bit lines according to the decoded address data in the X and Y decoders 61 and 62. A sense amplifier 66 amplifies a predetermined plurality of output data signals from the bit lines, and a sense amplifier output latch 67 takes in and outputs the output of the sense amplifier 66 by use of a second external clock signal (CLK2).

A selector address latch 78 takes in and outputs the output of the Y predecoder 62 by use of the second external clock signal (CLK2). A first selector address decoder 79 decodes the predecoded address data from the selector address latch 78, and a selector 68 selects one data from the plurality of data in the sense amplifier output latch 67 according to the decoded data from the first selector address decoder 79. An output latch 69 takes in and outputs the data from the selector 68 by use of a third clock signal (CLK3). An output buffer 70 holds and outputs the data from the output latch.

A write data input buffer 74 is provided for receiving write data, and a write data input latch 76 is provided for taking in and outputting the write data held in the write data input buffer 74 by use of CLK1. A second selector address decoder 80 decodes the output of the Y predecoder, and a write circuit 81 writes the write data from the write data input latch 76 in the memory cell of the memory cell array 65 according to the address data decoded by the second selector address decoder 80.

A control signal input buffer 75 is provided for receiving a control signal 73. A control signal input latch 77 takes in and outputs the control signal held in the control signal input buffer 75 by use of CLK1. A read/write control circuit 82 receives the control signal from the control signal input latch 77 and outputs signals for controlling the write circuit 81 and the sense amplifier 66. A CLK generating circuit 83 generates the clock signals (CLK1, CLK2, CLK3) fed to the respective latches from an external clock signal.

The following describes the case where one or more bits of the Y address taken in by use of the first external clock signal are identical with the corresponding bits of the Y address taken in by use of the second external clock signal. When the address is the selector address, the address is not input to the address latch 78 as illustrated by a dotted line of FIG. 5 but may be directly input to the first selector address decoder 79. The selector address latch 78 is connected between the first selector address decoder 79 and the selector 68. The first and second selector address decoders 79 and 80 may be replaced by a common (single) one.

With the arrangement above, 72 sense amplifier output latch circuits and 2 selector address latch circuits are required, whereas 512 decoder latch circuits are required in the conventional apparatus in a 2M-bit CMOS cache SRAM (×36). In other words, the number of latch circuits is reduced to about ⅙. Therefore, it is possible to prevent an increase in the chip area resulting from providing such latch circuits as those required for reducing the cycle time. With the arrangement above, since the number of write data latches and the control signal latches that are required in the conventional apparatus can be omitted, the number of latch circuits can be prevented from increasing. In a 2M-bit CMOS cache SRAM (×36), 37 circuits in total including write data and control signal latch circuits can be omitted as compared with the conventional apparatus.

Figure 6:
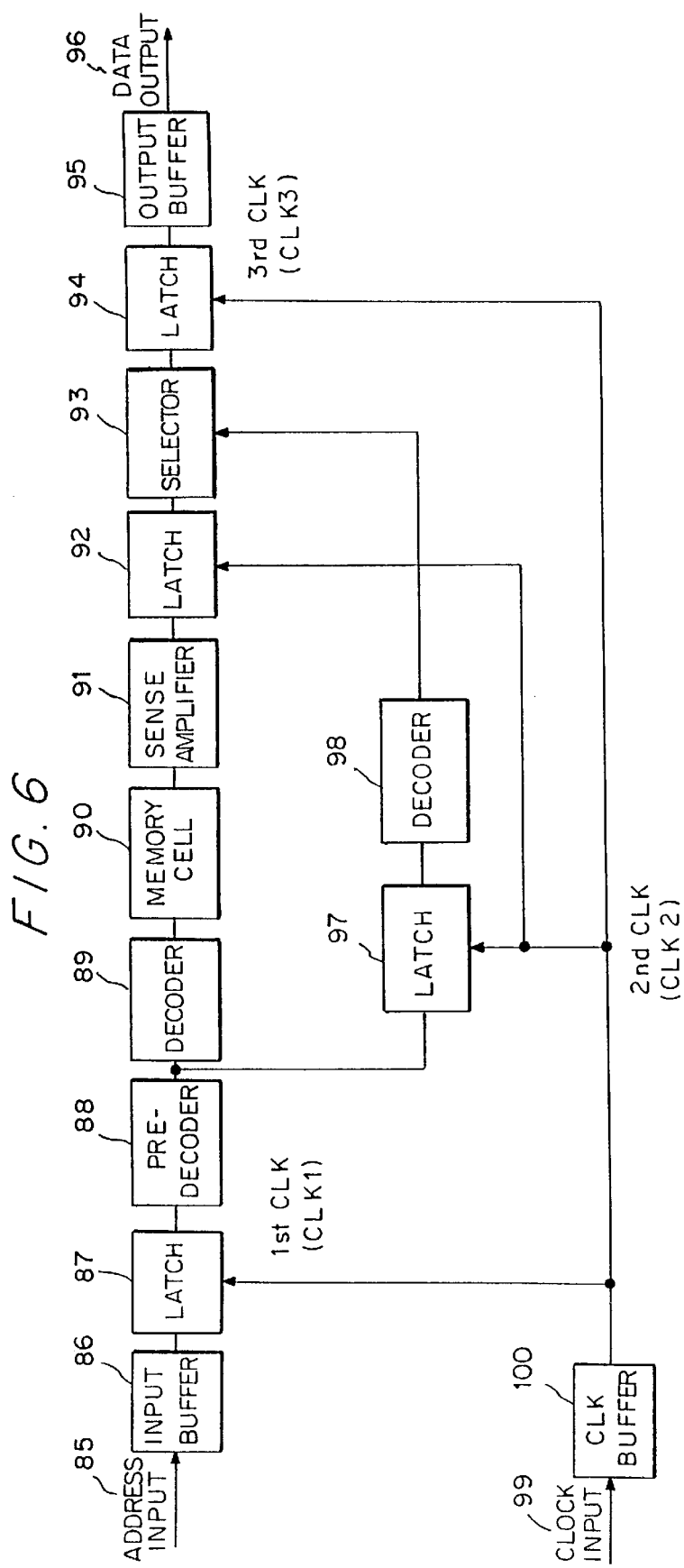
FIG. 6 is a block diagram illustrating the simplified flow of address, data and clock signals in the second embodiment of the present invention.

FIG. 6 illustrates the simplified flow of address, data and clock signals in the second embodiment of the present invention illustrated in FIG. 5. First, an address 85 is held in the address latch 87 via the input buffer 86. When CLK1 is input to the address latch 87 then, the address is output from the latch 87 and decoded by the predecoder 88 and the decoder 89. A memory cell 90 is selected according to the decoded data. Data is output from the selected memory cell 90 and amplified by the sense amplifier 96. The amplified data is held in the sense amplifier output latch 92. Part of the address predecoded in the predecoder 88 is held in the selector address latch 97. When CLK2 is input to the selector address latch 87 then, its output is decoded by the selector address decoder 98 and the decoded data is input to the selector 93. When CLK2 is input to the sense amplifier output latch 97, the data is input to the selector 93, and one data is selected according to the data decoded by the selector address decoder 98. The data is then held in the output data latch 94. When CLK3 is input to the output data latch 94, data 96 is output outside the chip via the output buffer 95.

Figure 7:
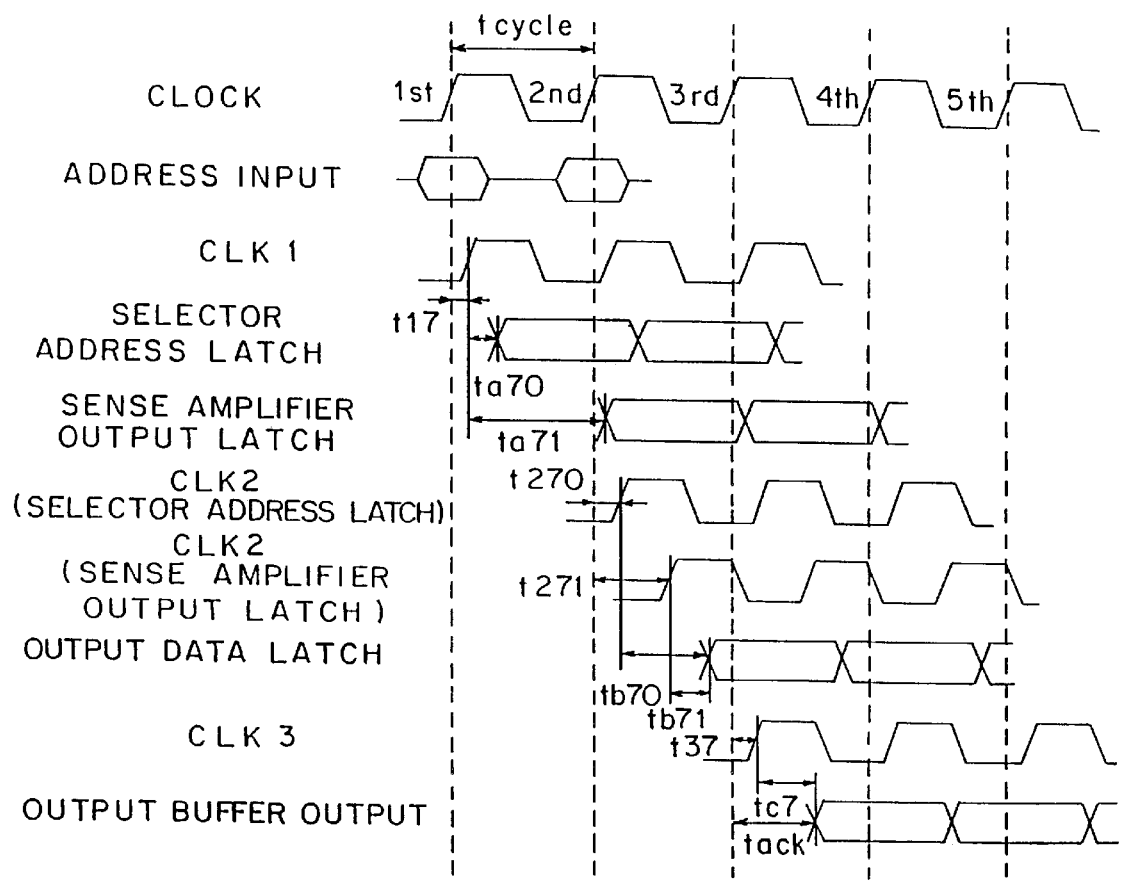
FIG. 7 is a waveform chart at the time of reading in the second embodiment of the present invention.

FIG. 7 illustrates operating waveforms at the time of reading in the second embodiment of the present invention illustrated in FIG. 5. When an address is received from outside the chip, the address is held in the address latch 87 via the input buffer 86. Subsequently, CLK1 is input to the address latch 87 at time t17 after the input of the first external clock signal (1st), and the address data is output. The output is decoded by the predecoder 88 and the decoder 89. A word line is selected according to the decoded data. A plurality of data are read from the memory cells 90 and amplified by the sense amplifier 91. The amplified data are held in the sense amplifier output latch 92. The time required during this time is ta71. Part of the output of the predecoder 88 is held in the selector address latch 97 as a selector address. The time required for the selector address latch 97 input by use of CLK1 then is ta70. Although ta70<ta71 in FIG. 7, ta70>ta71 is also possible.

After the above, CLK2 is input to the selector latch at time t270 after the input of the second external clock signal (2nd). The predecoded signal of the selector address is output, and the output is decoded by the selector address decoder 98 and input to the selector 93. CLK2 is input to the sense amplifier output latch 92 at time t271 after the input of the second external clock signal (2nd) (though t270<t271 is illustrated in FIG. 7, t270>t271 is also possible). The plurality of data are output. The plurality of outputs are input to the selector 93. Subsequently, one of the plurality of data is selected according to the decoded signal, and the selected data is held in the output latch 94. The time required during this time is tb70 from the selector 93 address input by use of CLK2, and tb71 from the sense amplifier output latch 92 input by use of CLK2.

Lastly, CLK3 is input to the output latch 94 at time t37 after the input of the third external clock signal (3rd), and output data is output. The output data is output from the chip via the output buffer 95 at time tc7. At this time, t37+tc7= tack (clock access time). In order to ensure the aforesaid operation, t17+ta70<tcycle+t270, t17+ta71<tcycle+t271, t270+tb70<tcycle+t37, t271+tb71<tcycle+t37 have to be satisfied. Thus, the data can be output from the chip at the third cycle for the construction of the second embodiment of the present invention illustrated in FIG. 5 like the conventional apparatus.

The operating waveforms at the time of writing in the second embodiment of the present invention illustrated in FIG. 5 are similar to those at the time of writing in the first embodiment illustrated in FIG. 4. In the second embodiment of the present invention as in the first embodiment, unlike the conventional apparatus the word line can be selected at the first cycle by not using a decoder latch, and the write data can reach the memory cell at the first cycle by omitting the write data latch and the control signal latch, whereby the data can be written at the first cycle. Unlike conventional apparatus in which the data is written at the second cycle, the write time can be shortened.

Figure 8:
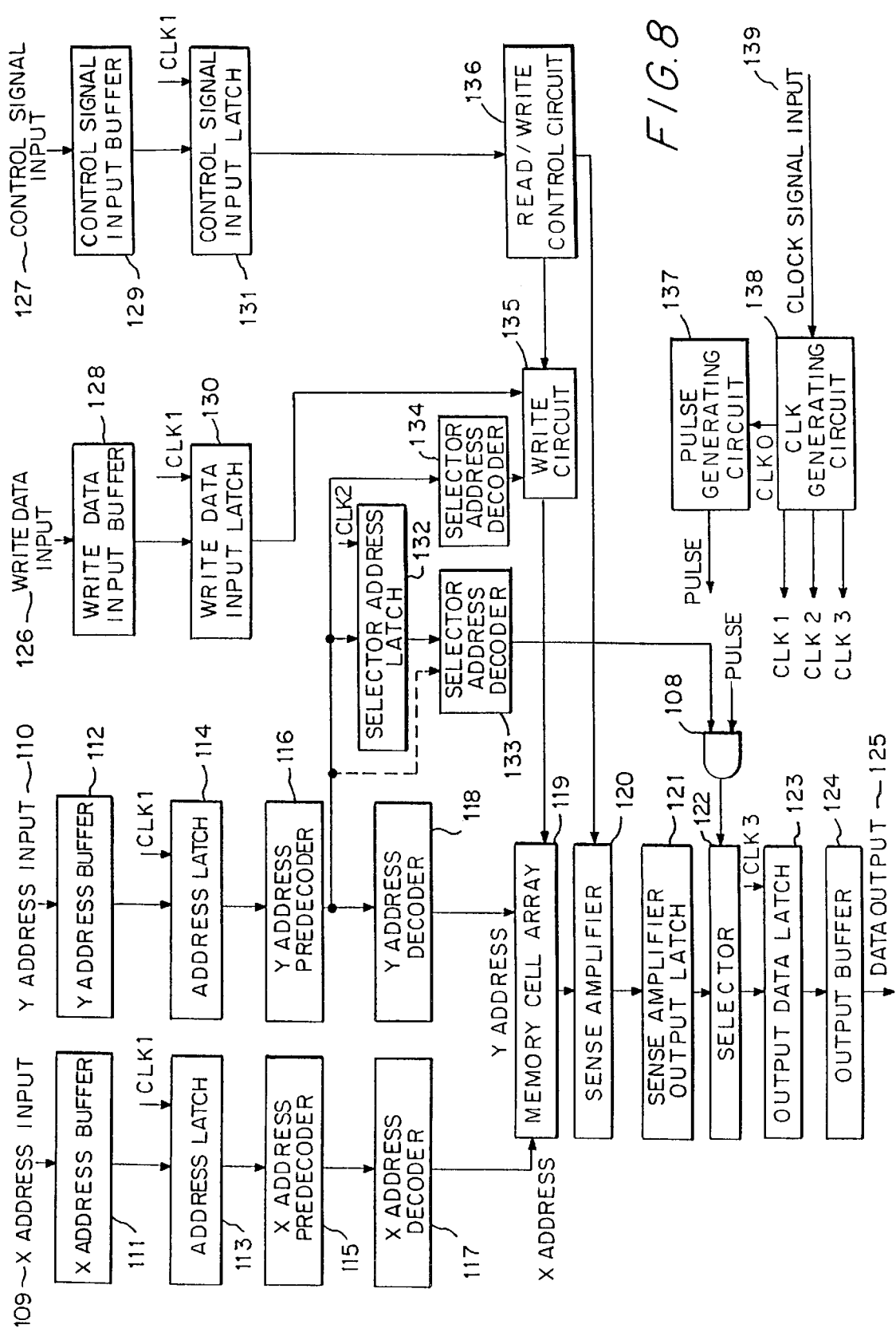
FIG. 8 is a block diagram illustrating a synchronous memory unit of a third embodiment of the present invention.

FIG. 8 illustrates a synchronous memory unit of a third embodiment of the present invention. As illustrated in FIG. 8, the synchronous memory includes an X address input buffer 111 for receiving X address data 109, a Y address input buffer 112 for receiving Y address data 110, X and Y address input latch 113 and 114, respectively, for taking in and outputting the address data held in the input buffers 111 and 112 by use of a first clock signal (CLK1), X and Y predecoders 115 and 116, respectively, for predecoding the X and Y address data from the input latches 113 and 114, and X and Y decoders 117 and 118, respectively, for decoding the X and Y predecoded address data from the X and Y predecoders 115 and 116.

A memory cell array 119 is provided having a predetermined plurality of memory cells in which write data are written via the bit lines. The memory cell array 119 outputs the data held in a predetermined plurality of memory cells via bit lines according to the decoded address data from the X and Y decoders 117 and 118. A sense amplifier 120 is provided for amplifying a predetermined plurality of output data signals from the bit lines. A sense amplifier output latch 121 latches the output of the sense amplifier 120 and a selector address latch 132 takes in and outputs the output of the Y predecoder 116 by use of a second external clock signal (CLK2). A first selector address decoder 133 decodes the predecoded address data from the selector address latch 132, and AND circuit 108 converts a selector address to a pulse by ANDing the output of the first selector address decoder 133 and the one-shot pulse (PULSE) generated from a clock signal (CLK0) in a pulse generating circuit 137.

A selector 122 selects one data from the plurality of data in the sense amplifier output latch 121 according to the pulsed decoded data, and an output latch 123 takes in and outputs the data from the selector 122 by use of a third clock signal (CLK3). An output buffer 124 holds and outputs the data from the output latch 123.

A write data input buffer 128 is provided for receiving write data 128, and a write data input latch 130 is provided for taking in and outputting the write data held in the write data input buffer 128 by use of CLK1. A second selector address decoder 134 decodes the output of the Y predecoder 116, and a write circuit 135 writes the write data from the write data input latch 130 in the memory cell of the memory cell array 119 according to the decoded data in the second selector address decoder 134.

A control signal input buffer 129 is provided for receiving a control signal 127, and a control signal input latch 131 is provided for taking in and outputting the control signal held in the control signal input buffer 129 by use of CLK1. A read/write control circuit 136 receives the control signal from the control signal input latch 131 and outputs signals for controlling the write circuit 135 and the sense amplifier 120. Clock generating circuit 138 generates the clock signals (CLK1, CLK2, CLK3) fed to the respective latches from an external clock signal 139, and a pulse generating circuit 137 generates a pulse used by the AND gate 108.

If one or more bits of the Y address are identical, when taken in at the first external clock signal, to the corresponding bits of the Y address, taken in at the second external clock signal, then the selector address is not input to the selector address latch 132. The selector as illustrated by a dotted line of FIG. 8, may directly be input to the first selector address decoder 133. Further, the first selector address latch 132 can be provided between the first selector address decoder 133 and the selector 122, and the first and second selector address decoders 13 and 134, respectively, may be replaced with a common (single) decoder.

The selector address may be transformed to a pulse in between the selector address latch 132 and the selector address decoder 133. When one or more bits of the Y address taken in by use of the first external clock signal are identical with the corresponding bits of the Y address taken in by use of the second external clock signal. The address that is input to the first selector address decoder may directly be transformed to a pulse in between the Y address latch 114 and the selector address decoder 133.

With the arrangement above, 72 sense amplifier output latch circuits and 2 selector address latch circuits are required, whereas 512 decoder latch circuits are required in the conventional apparatus in a 2M-bit CMOS cache SRAM (×36). In other words, the number of latch circuits is reduced to about ⅙. Therefore, it is possible to prevent an increase in the chip area resulting from providing the latch circuits used for cycle time shortening. With the arrangement above, since the write data latch and the control signal latch that have heretofore been required in the conventional apparatus can be omitted, the number of latch circuits is prevented from increasing. In the 2M-bit CMOS cache SRAM (×36), 37 circuits in total including write data and control signal latch circuits can be omitted as compared with the conventional apparatus.

Figure 9:
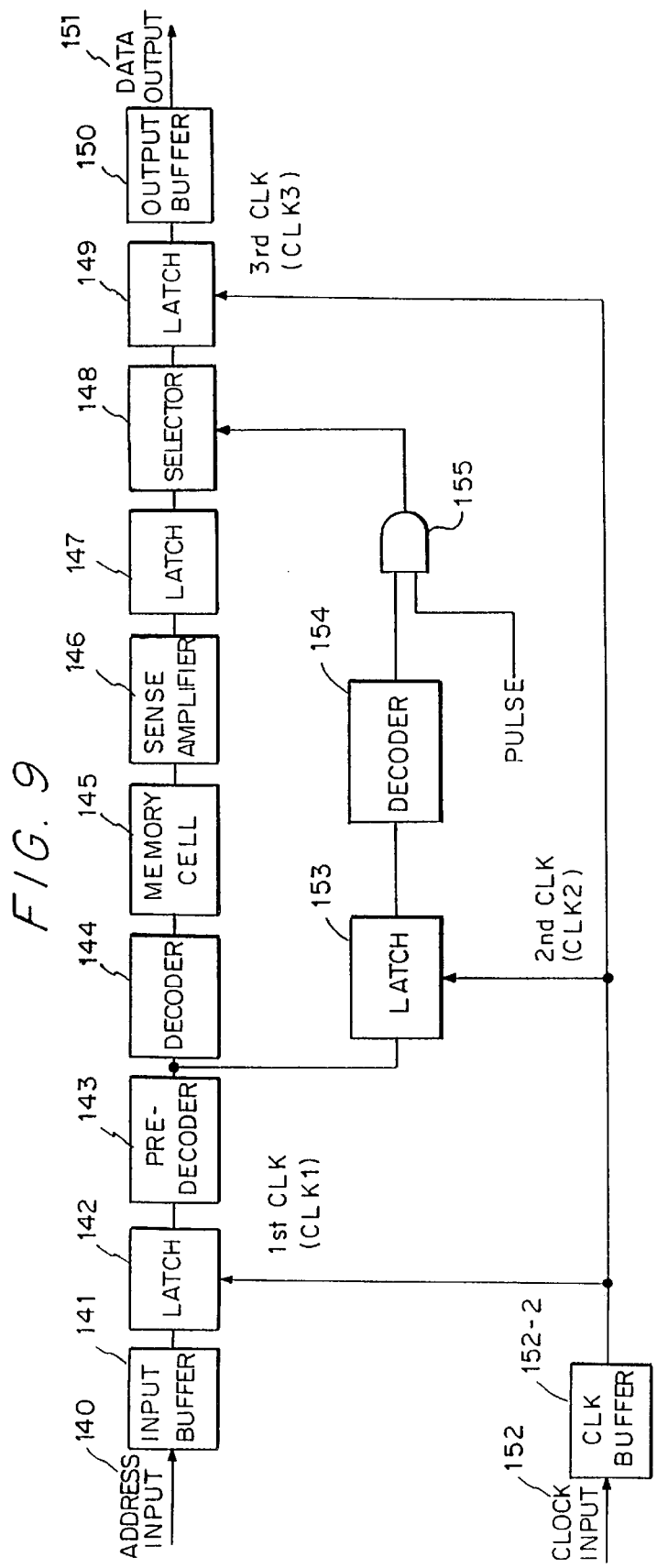
FIG. 9 is a block diagram illustrating the simplified flow of address, data and clock signals in the third embodiment of the present invention.

FIG. 9 illustrates the simplified flow of address, data and clock signals in the third embodiment of the present invention illustrated in FIG. 8. First, an address 140 is held in the address latch 142 via the input buffer 141. When CLK1 is input to the address latch 142, the address is output from the latch 142 and decoded by the predecoder 143 and the decoder 144. A memory cell 145 is selected according to the decoded data. Data is output from the selected memory cell 145 then and amplified by the sense amplifier 146. The amplified data is held in the sense amplifier output latch 147. Part of the address predecoded by the predecoder 143 is held in the selector address latch 153. When CLK2 is input to the selector address latch 153, its output is decoded by the selector address decoder 154 and transformed to a pulse with the one-shot pulse generated from the clock signal by the pulse generating circuit 155. In the selector 148, one data is selected according to the decoded data in the selector address decoder 154 and held in the output data latch 149. When CLK3 is input to the output data latch 149, data is output outside the chip via the output buffer 150.

Figure 10:
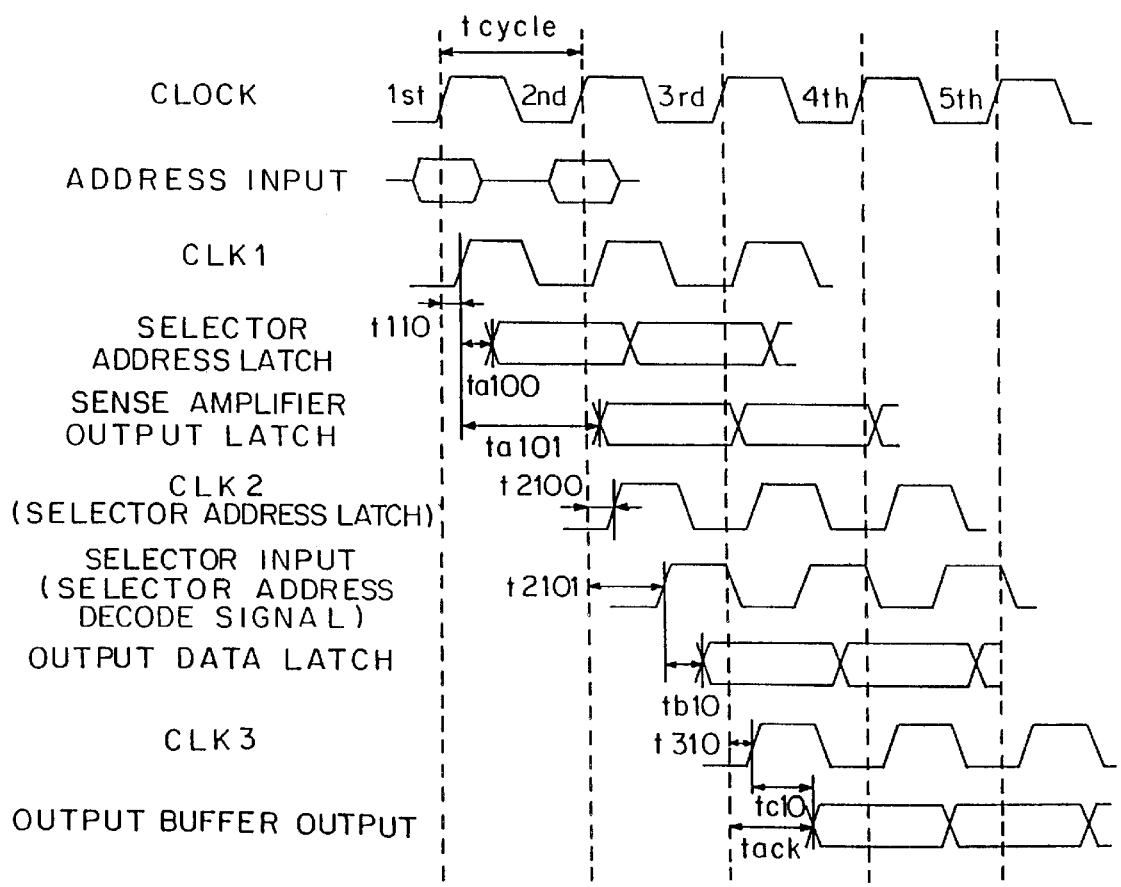
FIG. 10 is a waveform chart at the time of reading in the third embodiment of the present invention.

FIG. 10 illustrates operating waveforms at the time of reading in the third embodiment of the present invention illustrated in FIG. 8. When an address is received from outside the chip first, the address is held in the address latch 142 via the input buffer 141. Subsequently, CLK1 is input to the address latch 142 at time t110 after the input of the first external clock signal (1st), and the address data is output. The output is decoded by the predecoder 143 and the decoder 144.

A word line is selected according to the decoded data, and a plurality of data are read from the memory cells 145. The data is amplified by the sense amplifier 146, and the amplified data are held in the sense amplifier output latch 147. The time required during this time is ta101. Part of the output of the predecoder 143 is held in the selector address latch 153 as a selector address. The time required from the address latch 142 input by use of CLK1 is ta100. Although ta100<ta101 in FIG. 10, ta100>ta101 is also possible. Further, CLK2 is input to the selector address latch 153 at time t2100 after the input of the second external clock signal (2nd), and the output of the selector address latch 153 is decoded by the selector address decoder 154, and transformed to a pulse with a one-shot pulse generated from the clock signal by the pulse generating circuit 155. The pulse is input to the selector 148. At this time, the time required from the second external clock input (2nd) is t2101. Further, one of the plurality of data is selected by the selector 148 according to the decoded data by the selector address decoder 154, and the selected data is held in the output latch 149. The time required during this time is tb10.

Lastly, CLK3 is input to the output latch 149 at time t310 after the inputting of the third external clock signal (3rd), and output data 151 is output. The output data is output outside the chip via the output buffer 150 at time tc10. At this time, t310+tc10=tack (clock access time). In order to ensure the aforesaid operation, inequalities t110+ta100<tcycle+t2100 and t2101+tb10<tcycle+t310 have to be satisfied. As t110+ta101<tcycle+t2101, the data at the preceding cycle is preferably transferred to the next and later stages of the selector 148. Thus, the data can be output from the chip at the third cycle in accordance with the third embodiment of the present invention illustrated in FIG. 8 like the conventional apparatus.

The operating waveforms at the time of writing in the third embodiment of the present invention illustrated in FIG. 8 are similar to those at the time of writing (FIG. 4) in the first embodiment illustrated in FIG. 4. In the third embodiment of the present invention as in the first embodiment thereof, unlike the conventional apparatus, the word line can be selected at the first cycle by not using a decoder latch. Also the write data can reach the memory cell at the first cycle by omitting the write data latch 130 and the control signal latch 131. Thus, unlike the conventional apparatus at which the data is written at the second cycle, the write time can be shortened.

Figure 11:
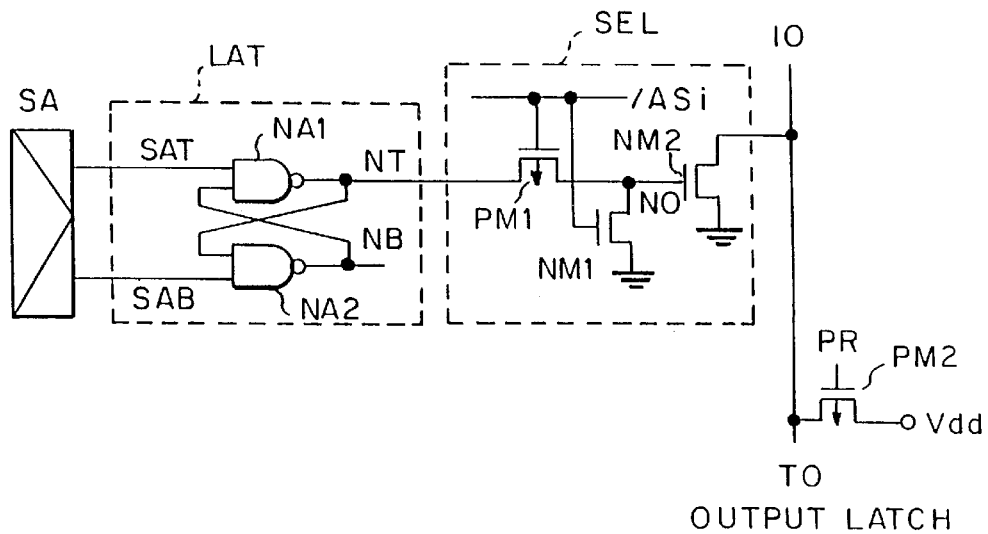
FIG. 11 is a diagram illustrating examples of the sense amplifier output latch circuit and the selector circuit in the third embodiment of the present invention.

FIG. 11 illustrates examples of the sense amplifier output latch 147 and the selector 148 in the third embodiment of the present invention. The sense amplifier output latch 147 (LAT) is a flip-flop having two NAND gates (NA1, NA2) receiving the outputs (SAT, SAB) of the sense amplifier 146. The selector 148 (SEL) includes a PMOS FET (PM1) whose gate is connected to the inverted signal (/ASi) of the pulsed selector address decode signal and whose source is connected to one output (NT) of the sense amplifier output latch 147, a NMOS FET (NM1) whose gate is connected to /ASi, whose source is connected to the ground potential and whose drain is connected to the drain (NO) of PM1; and an NMOS FET (NM2) whose gate is connected to NO, whose source is connected to the ground potential and whose drain is connected to a data line (IO). The data line is connected to the output data latch 149 and to the drain of a PMOS FET (PM2) whose gate is connected to a data-line precharge control signal (PR) and whose source is connected to the power supply voltage (Vdd).

Figure 12:
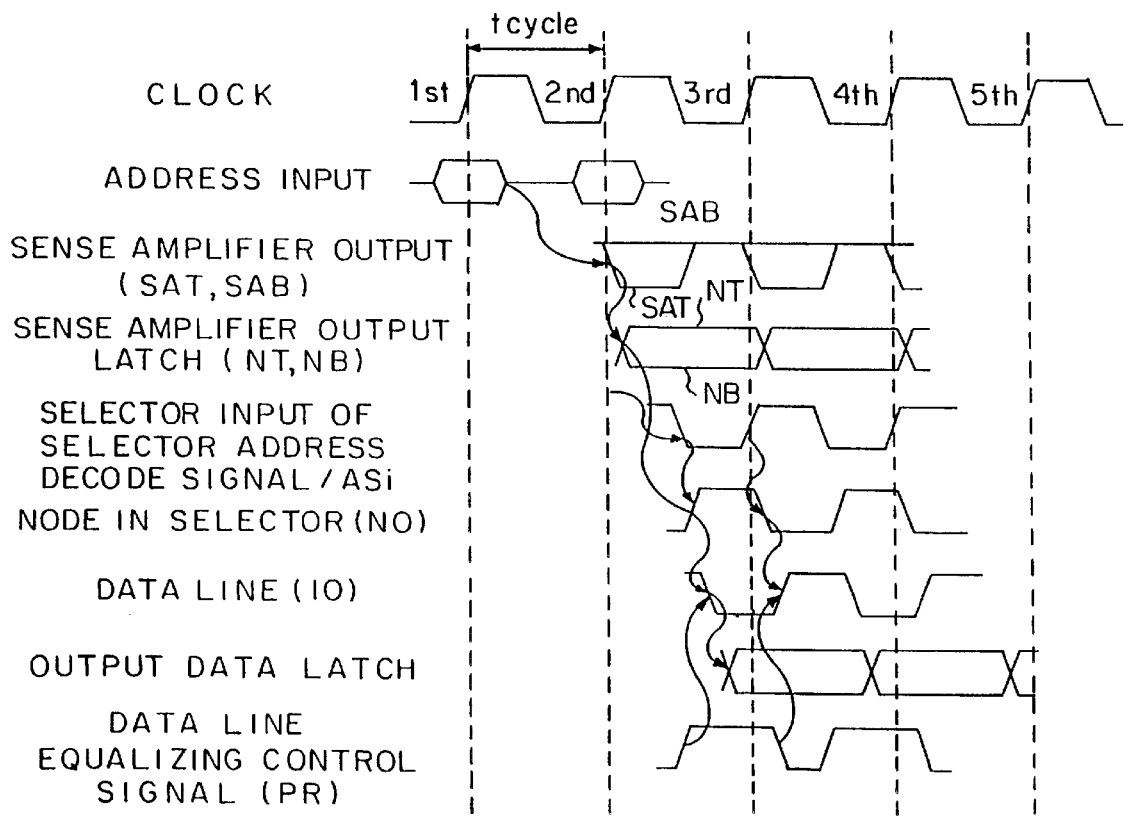
FIG. 12 is a waveform chart of the sense amplifier output latch circuit and the selector circuit illustrated in FIG. 11.
Figure 13:
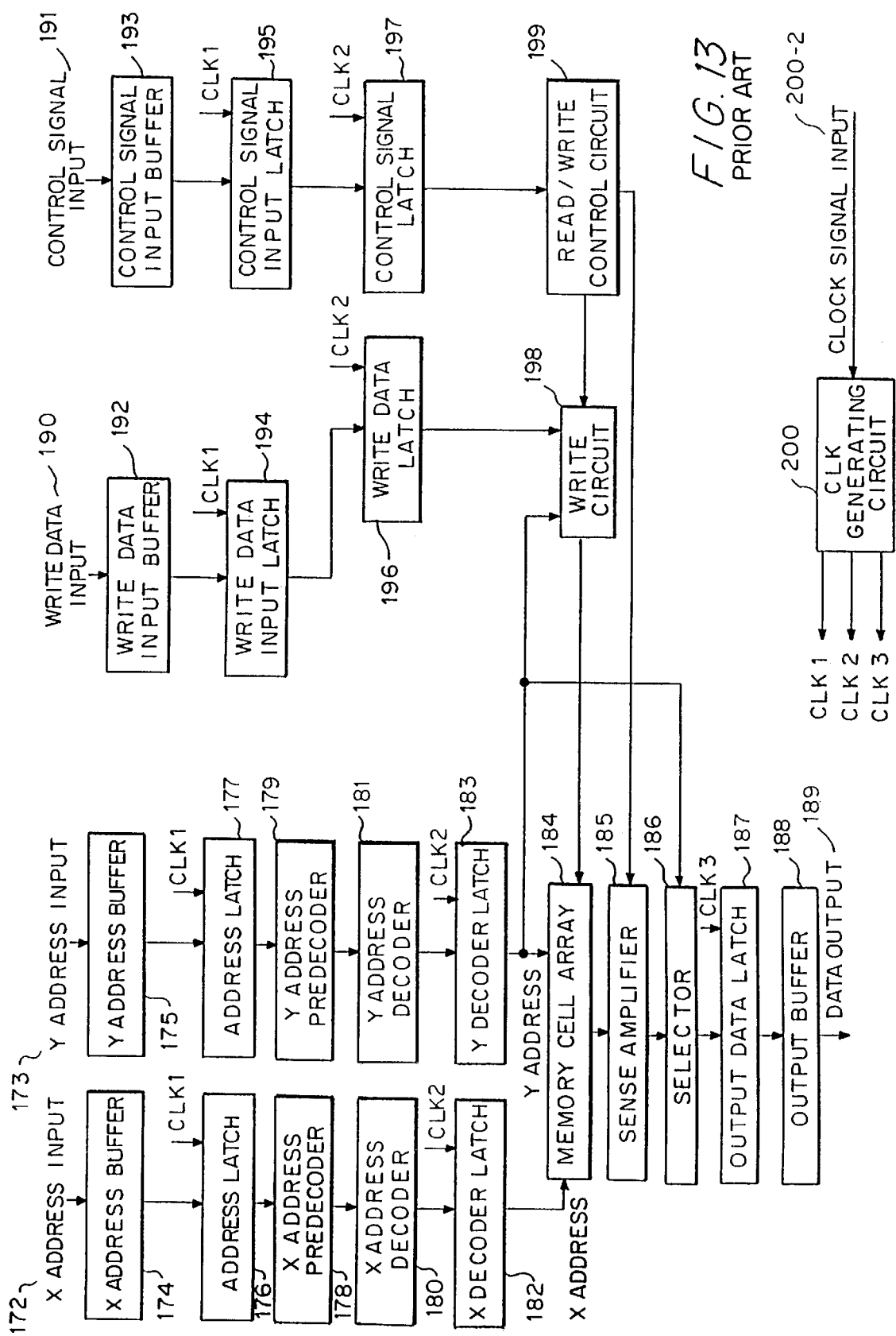
FIG. 13 is a block diagram illustrating an example of the conventional apparatus.
Figure 14:
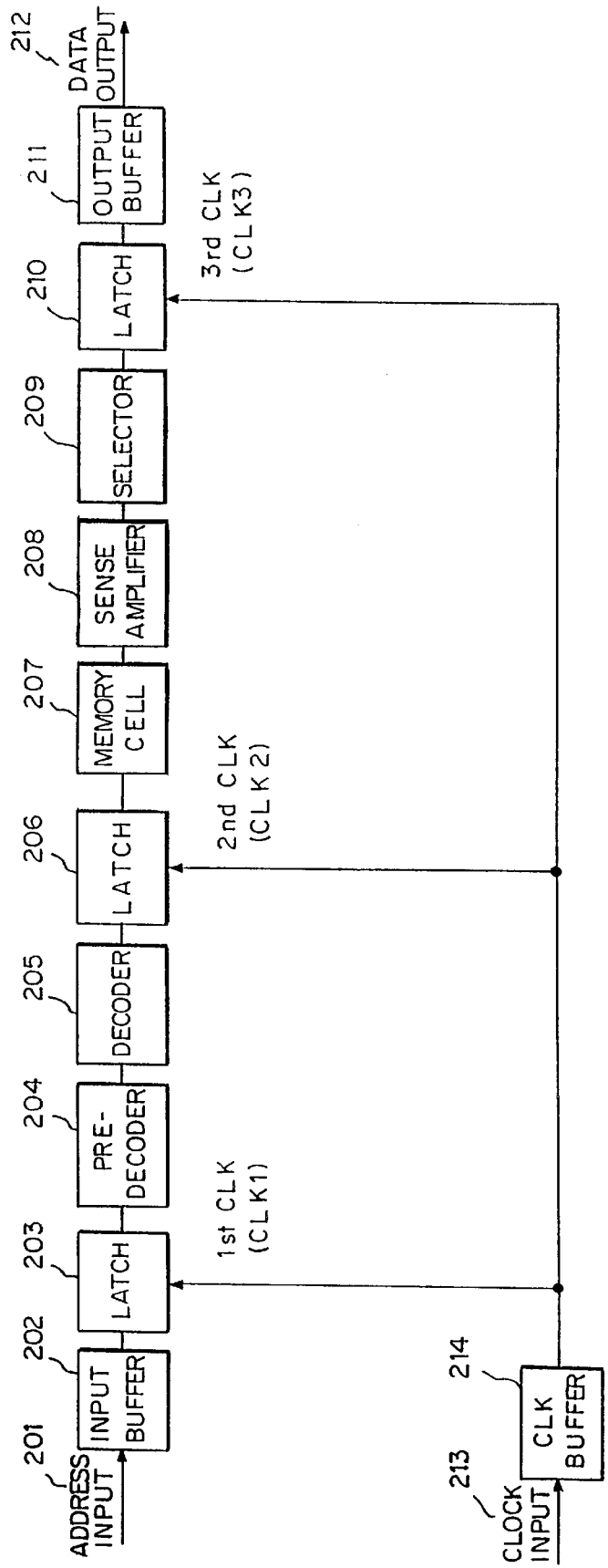
FIG. 14 is a block diagram illustrating the simplified flow of address, data and clock signals in the example of the conventional apparatus.
Figure 15:
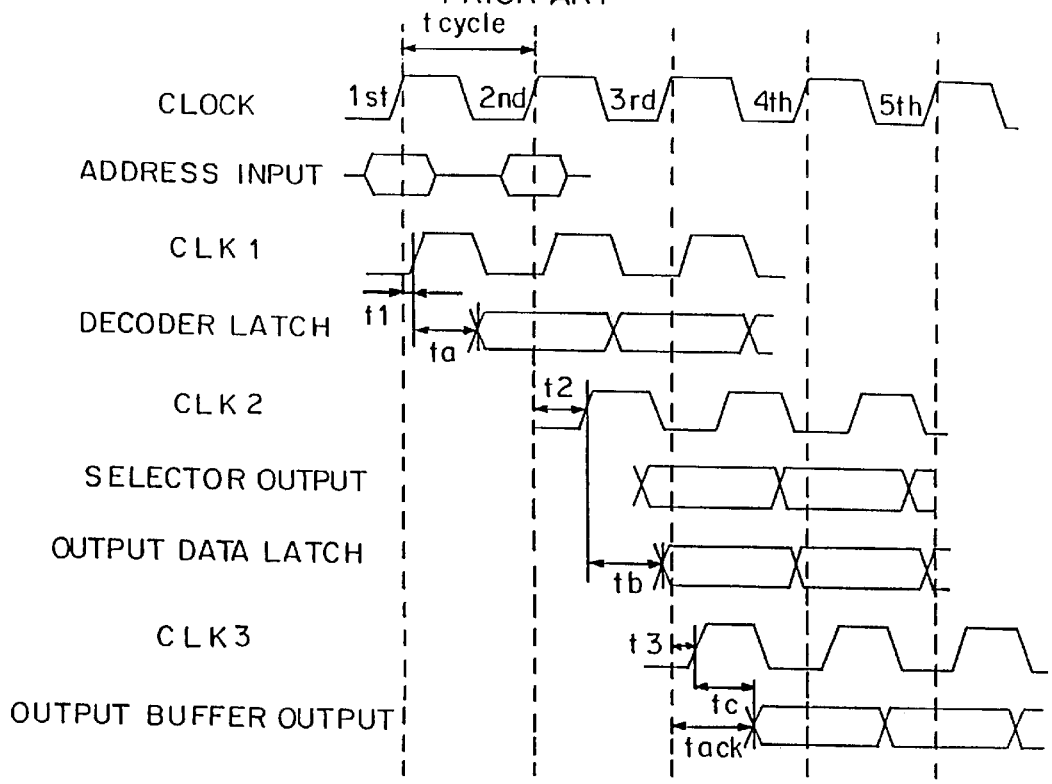
FIG. 15 is a waveform chart at the time of reading in the example of the conventional apparatus.

FIG. 12 illustrates waveforms of the circuits illustrated in FIG. 11. An address is input in synchronization with the first external clock signal (1st) and decoded by the predecoder 143 and the decoder 144. Then a word line is selected according to the decoded address, and data is read from the memory cell 145. The data thus read out is amplified by the sense amplifier 146 (SAT, SAB) and held in LAT 147 (NT, NB). PM1 is kept off because /ASi is at a high level at this time. Accordingly, the data in NT (at a high level) is not transferred to NO. When the second external clock signal is input and when CLK2 is input to the selector address latch 153, the predecoded signal of the selector address is output. The output is decoded by the selector address decoder 154 and converted to a pulse with a one-shot pulse generated from the clock signal by the pulse generating circuit 155, and input to the selector 148. Consequently, /ASi is set to a low level, the data in NT is transferred to NO, and NM2 is driven to transfer the data to IO. Since PR remains at a high level at this time, PM2 is kept off. Accordingly, no excessive current flows to the ground potential via NM2. Then pulsed /ASi is set to a high level, and PM1 and NM1 are respectively turned off and on, which results in setting NO to a low level and turning off NM2. At this time PR is set to a low level and IO is precharged to Vdd. Consequently, each node (NO, IO) returns to the initial state in which each node is ready to read the next data.

The present invention further accomplishes the features of the present invention so as to operate faster than the conventional apparatus by providing an edge trigger type latch circuit for the latches included in each of the embodiments of the present invention. Particularly, the edge trigger type latch circuit can be used, for example, for the sense amplifies output latch and the output data latch provided in each of the embodiments of the present invention as described above. First and second embodiments of the edge trigger type latch circuit of the present invention are illustrated in FIGS. 17 and 18 of the present application and operate in the manner as that described in Table 1 below.

TABLE 1

| CLK | Switch A | Switch B | Switch C | Switch D | Data$_{new}$ | Data$_{old}$ |
|---|---|---|---|---|---|---|
| Low | ON | OFF | OFF | ON | Input** to Latch L$_1$ | Latched in Latch L$_2$ |
| High | OFF | ON | ON | OFF | Latched* In Latch L$_2$ | Output From Latch L$_2$ |

Figure 17:
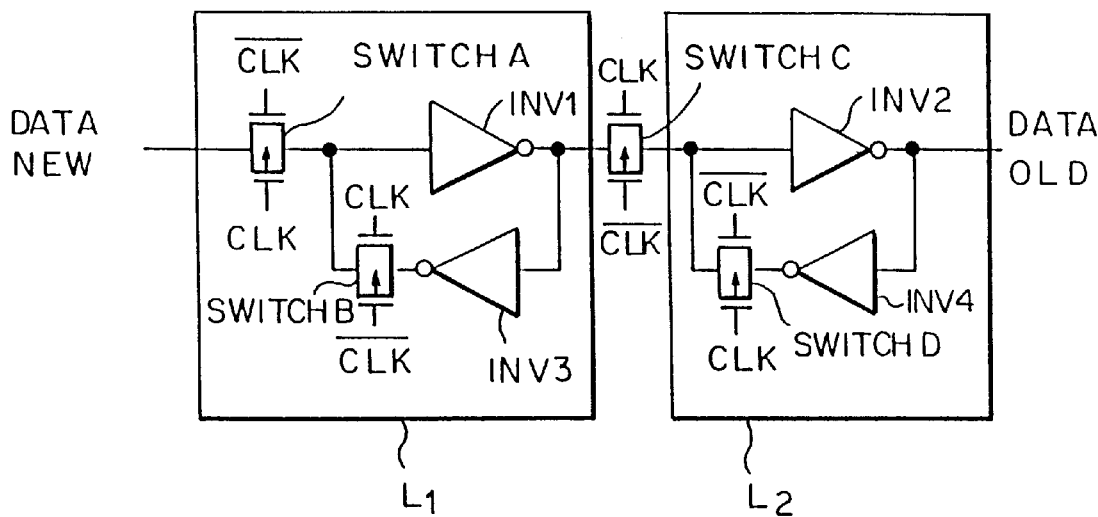
FIG. 17 is a diagram illustrating a first embodiment of an edge trigger type latch circuit of the present invention.
Figure 18:
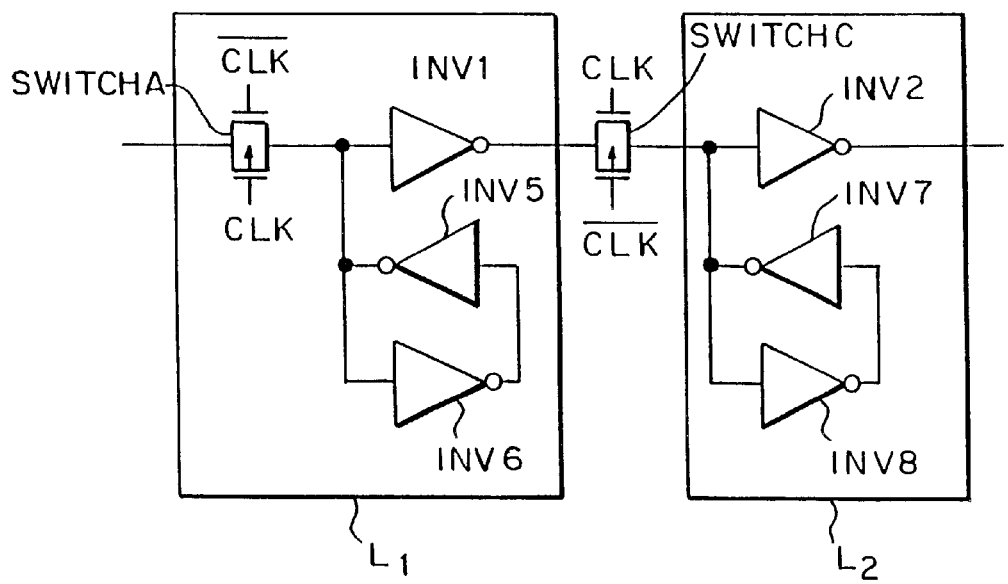
FIG. 18 is a diagram illustrating a second embodiment of an edge trigger type latch circuit of the present invention.

*Data$_{new}$ Latched in Latch L$_2$ Where Data$_{old}$ was
**Data$_{new}$ Latched in Latch L$_1$ The first embodiment of the edge trigger type latch circuit as illustrated in FIG. 17 includes a first latch L$_1$ and a second latch L$_2$ between which is connected is switch C. It should be noted that each of the switches illustrated in FIGS. 17 and 18 can be field effect transistors (FETS) of the MOS or junction type having a particular conductivity. First Latch L$_1$ receives Data$_{new}$ on an input terminal and second latch L$_2$ outputs Data$_{old}$ on an output terminal.

The first Latch L$_1$ of the first embodiment includes switch A having a first conductivity which is connected to the input terminal for receiving Data$_{new}$ and switch B having a conductivity opposite to that of switch A. The input terminal of switch B is connected to the output terminal of switch A. The first Latch L$_1$ also includes an inverter INV1 having an input terminal connected to the output terminal of switch A and an inverter INV3 having an input terminal connected to the output terminal of inverter INV1 and an output terminal connected to the input terminal of switch B. The output terminal of inverter INV1 and the input terminal of inverter INV3 are connected to the input terminal of switch C. Switch C has a conductivity same as that of switch B.

The second Latch L$_2$ of the first embodiment includes an inverter INV2 having an input terminal connected to the output terminal of switch C and an output terminal connected to the output terminal of latch L$_2$ from which Data$_{old}$ is output. The output terminal of inverter INV2 is also connected to the input terminal of inverter INV4. The output terminal of inverter INV4 is connected to the input terminal of switch D having a conductivity same as that of switch A. The output terminal of switch D is connected to the input terminal of inverter INV2.

The second embodiment of the edge trigger type latch circuit illustrated in FIG. 18 includes a first latch L$_1$ and a second latch L$_2$. Connected between the first latch L$_1$ and the second latch L$_2$ is switch C. The first Latch L$_1$ is connected to the input terminal for receiving Data$_{new}$ and the second latch L$_2$ is connected to the output terminal for outputting Data$_{old}$.

The first Latch L$_1$ of the second embodiment includes switch A of a particular conductivity having its input terminal connected to the input terminal for receiving Data$_{new}$, inverter INV1 having an input terminal connected to the output terminal of switch A and an output terminal connected to the input terminal of switch C, and an inverter INV5 having an output terminal connected to the input terminal of inverter INV1 and an inverter INV6 having an input terminal connected to the output terminal of inverter INV5 and an output terminal connected to the input terminal of inverter INV5.

The second Latch L$_2$ of the second embodiment includes an inverter INV2 having an input terminal connected to the output terminal of switch C and an output terminal connected to the output terminal of the second Latch L$_2$ for outputting Data$_{old}$. Also included in the second latch L$_2$ is an inverter INV7 having an output terminal connected to the input terminal of inverter INV2 and an invert INV8 having an input terminal connected to the output terminal of inverter INV7 and an output terminal connected to the input terminal of inverter INV7. Switch C has a conductivity opposite to that of switch A.

According to Table 1 the first embodiment of the edge trigger type latch circuit illustrated in FIG. 17 operates as follows. When the clock is low switch A is on, thereby permitting the flow of Data$_{new}$ from the input terminal of switch A to the input terminal of inverter INV1. The inverter INV1 inverts Data$_{new}$ and outputs it from the output terminal of inverter INV1 to the input terminal of inverter INV3 and the input terminal of switch C. Switch B is off thereby preventing the flow of Data$_{new}$ from the output terminal of inverter INV3 and switch C is off thereby preventing the flow of Data$_{new}$ from the output terminal of inverter INV1 to the second Latch L$_2$. Switch D is on, thereby permitting the flow of data from the output terminal of inverter INV4 to the input terminal of inverter INV2. The output terminal of inverter INV2 Data$_{old}$ on the output terminal of the second latch L$_2$. Accordingly, Data$_{new}$ is coming into the first latch L$_1$ and Data$_{old}$ is latched in the second latch L$_2$ and output on the output terminal of second latch L$_2$.

If the clock CLK is high then switch A is off thereby preventing the flow of Data$_{new}$ to the input terminal of inverter INV1. Switch B is on, thereby permitting the flow of Data$_{new}$ from the output terminal of inverter INV3 to the input terminal of inverter INV1. Further, switch C is on thereby permitting the flow of Data$_{new}$ from the output terminal of inverter INV1 to the input terminal of inverter INV2. Switch D is off thereby preventing the flow of Data$_{old}$ from the output terminal of inverter INV4 to the input terminal of inverter INV2. Accordingly, Data$_{new}$ applied to the input terminal of inverter INV2 from switch C is output as Data$_{old}$ latched in the second latch L$_2$ and output on the output terminal of the second latch L$_2$ when the clock CLK becomes low.

The edge trigger type latch circuit of the second embodiment of the present invention illustrated in FIG. 18 operates in a manner similar to that described above with respect to the first embodiment of the edge trigger type latch circuit illustrated in FIG. 17. Table 1 is applicable to both FIGS. 17 and 18. Accordingly, when the clock CLK is low switch A is on, thereby latching Data$_{new}$ into the first latch L$_1$, switch C is off thereby preventing the flow of Data$_{new}$ from the first latch L$_1$. Thus, the second latch L$_2$ outputs Data$_{old}$ on the output terminal from the second latch L$_2$. When the clock CLK is high switch A is off thereby preventing the inputting of Data$_{new}$ from the input terminal of the first latch L$_1$ and switch C is on thereby permitting the flow of Data$_{new}$ from the first latch L$_1$ to the second latch L$_2$. Accordingly, Data$_{new}$ is latched in the second latch L$_2$ and output on the output terminal of the second latch L$_2$.

The most important feature of the edge trigger type latch circuit of the first and second embodiments illustrated in FIGS. 17 and 18 is that data is latched at the rising edge of a clock signal rather than when the clock signal reaches a particular level as in conventional apparatus. Latching data at the rising edge of a clock signal allows for the use of a clock signal having a shorter cycle which is not possible in the conventional apparatus since latching only occurs after the clock has stabilized at a predetermined level.

Although the preferred embodiments of the present invention have been described above, the invention is not limited to the embodiments thereof but may be modified in various manners in terms of the designing without departing from the spirit of the invention.

As is obvious from the aforesaid embodiments of the present invention, it is possible to prevent an increase in the chip area resulting from providing such latch circuits as those used for cycle time shortening by omitting decoder latch circuits and providing the selector output latch or selector address latch and the sense amplifier output latch. Further, the write time can be shortened since the data can be written at the first cycle by not using the write data latch and the control signal latch.

While the present invention has been described in detail and pictorially in the accompanying drawings, it is not limited to such details since many changes and modification recognizable to these of ordinary skill in the art may be made to the invention without departing from the spirit and scope of the invention, and all such modifications as would be obvious to one skilled in the art are intended to be included within the scope of the following claims.

We claim:

1. A synchronous memory unit comprising:

a plurality of input buffers for receiving address data;

a plurality of input latches for holding the address data held in the input buffers and outputting the address data according to a clock signal;

a plurality of decoders for decoding the address data from the input latches;

a memory cell array having a plurality of memory cells which store data signals and output data signals in a predetermined plurality of memory cells via bit lines according to the address data decoded by the decoders;

a sense amplifier for amplifying the output data signals on the bit lines;

a selector for selecting one amplified output data signal from the amplified output data signals from the sense amplifier according to the address data decoded by the decoders;

a selector output latch for holding the amplified output data signal from the selector and outputting the amplified output data signal according to the clock signal;

an output latch for holding the amplified output data signal from the selector output latch and outputting the amplified output data signal according to the clock signal; and an output buffer for receiving the amplified output data signal from the output latch and outputting the amplified output data.

2. A synchronous memory unit comprising:

a plurality of input buffers for receiving address data;

a plurality of input latches for holding the address data held in the input buffers and outputting the address data according to a clock signal;

a plurality of decoders for decoding the address data output from the input latches;

a memory cell array having a plurality of memory cells which store data signals in the memory cells and output data signals in a predetermined plurality of memory cells via bit lines according to the address data decoded by the decoders;

a sense amplifier for amplifying output data signals on the bit lines;

a selector address latch for holding selector address data for selecting one amplified output data signal from the amplified output data signals from the sense amplifier and outputting the selector address data according to the clock signal;

a sense amplifier output latch for holding the amplified output data signals from the sense amplifier and outputting the amplified output data signals according to the clock signal;

a selector for selecting one amplified output data signal from the amplified output data signals held in the sense amplifier output latch based on the selector address data from the selector address latch;

an output latch for holding the amplified output data signals from the selector and outputting the amplified output data signal according to the clock signal; and an output buffer for receiving the amplified output data signal from the output latch and outputting the amplified output data signal.

3. A synchronous memory unit comprising:

a plurality of input buffers for receiving address data;

a plurality of input latches for holding the address data held in the input buffers and outputting the address data according to a clock signal;

a plurality of predecoders for predecoding the address data from the input latches;

a plurality of decoders for decoding the address data predecoded by the predecoders;

a memory cell array having a plurality of memory cells which store data signals and output data signals in a predetermined plurality of memory cells via bit lines according to the address data decoded by the decoders;

a sense amplifier for amplifying the output data signals on the bit lines;

a selector address latch for holding selector address data for selecting one amplified output data signal of the amplified output data signals from the sense amplifier and outputting the selector address data according to the clock signal;

a plurality of selector address decoders for decoding the selector address data from the selector address latch;

a sense amplifier output latch for holding the amplified output data signals from the sense amplifier and outputting the amplified output data signals according to the clock signal;

a selector for selecting one amplified output data signal from the amplified output data signals held in the sense amplifier output latch according to the selector address data decoded by the selector address decoders;

an output latch for holding the amplified output data signal from the selector according to the clock signal; and an output buffer for receiving the amplified output data signal from the output latch and outputting the amplified output data signal.

4. A synchronous memory unit comprising:

a plurality of input buffers for receiving address data;

a plurality of input latches for holding the address data held in the input buffers and outputting the address data according to a clock signal;

a plurality of decoders for decoding the address data from the input latches;

a memory cell array having a plurality of memory cells which store data signals and output data signals in a predetermined plurality of memory cells via bit lines according to the address data decoded by the decoders;

a sense amplifier for amplifying output data signals on the bit lines;

a sense amplifier output latch for holding the amplified output data signals from the sense amplifier;

a selector address latch for holding selector address data for selecting one amplified output data signal from the amplified output data signals from the sense amplifier and outputting the selector address data according to the clock signal;

a pulsing circuit for converting the selector address data output from the selector address latch to a pulse;

a selector for selecting one amplified output data signal from the amplified output data signals in from the sense amplifier output latch based on the pulse output from the pulsing circuit;

an output latch for holding the amplified output data signal from the selector and outputting the amplified output data signal according to the clock signal; and an output buffer for receiving the amplified output data signal from the output latch and outputting the amplified output data signal.

5. A synchronous memory unit comprising:

a plurality of input buffers for receiving address data;

a plurality of input latches for holding the address data held and outputting the address data according to a clock signal;

a plurality of predecoders for predecoding the address data from the input latches;

a plurality of decoders for decoding the address data predecoded by the predecoders;

a memory cell array having a plurality of memory cells which store data signals and output data signals in a predetermined plurality of memory cells via bit lines according to the address data decoded by the decoders;

a sense amplifier for amplifying the output data signals on the bit lines;

a sense amplifier output latch for holding the output data signals from the sense amplifier;

a selector address latch for holding selector address data for selecting one amplified output data signal from the amplified output data signals from the sense amplifier and outputting the selector address data according to the clock signal;

a plurality of selector address decoders for decoding the selector address data from the selector address latch;

a pulsing circuit for converting the selector address data decoded by the selector address decoders to a pulse;

a selector for selecting one amplified output data signal from the amplified output data signals in the sense amplifier output latch based on the pulsed output from the pulsing circuit;

an output latch for holding the amplified output data signal from the selector and outputting the amplified output data signal according to the clock signal; and an output buffer for receiving the amplified output data signal from the output latch and outputting the amplified output data signal.

6. A synchronous memory unit according to claim 1, wherein each latch comprises:

a first latch for holding a data signal and outputting the data signal according to the clock signal;

a first switch connected to said first latch for allowing a data signal to pass to said first latch according to the clock signal;

a second latch for holding a data signal and outputting the data signal according to the clock signal;

a second switch, connected between said first latch and said second latch, for allowing a data signal to pass from said first latch to said second latch according to the clock signal.

7. A synchronous memory unit according to claim 6, wherein said first latch comprises:

an input terminal connected to said first switch;

a first inverter having a first terminal connected to said input terminal and a second terminal connected to said second switch;

a second inverter having a first terminal connected to said second switch; and a fourth switch connected between a second terminal of the second inverter and the first switch, for allowing a data signal to pass from the second inverter to the first inverter according to the clock signal.

8. A synchronous memory unit according to claim 7, wherein said second latch comprises:

an input terminal connected to said second switch;

a first inverter having a first terminal connected to said input terminal and a second terminal connected to an output terminal;

a second inverter having a first terminal connected to said output terminal; and a fifth switch, connected between a second terminal of the second inverter and the input terminal, for allowing a data signal to pass from the second inverter to the first inverter according to the clock signal.

9. A synchronous memory unit according to claim 5, wherein the pulsing circuit is provided between the selector address latch and selector address decoders.

10. A synchronous memory unit according to claim 5, wherein part of the predecoded address data is directly input to the selector address decoders.

11. A synchronous memory unit according to claim 9, wherein part of the predecoded address data is directly input to the selector address decoders.

12. A synchronous memory unit according to claim 10, wherein the pulsing circuit is provided between the address predecoder and the selector address decoder to convert part of the predecoded address data to a pulse.

13. A synchronous memory unit according to claim 11, wherein the pulsing circuit is provided between the address predecoder and the selector address decoder to convert part of the predecoded address data to a pulse.

14. A synchronous memory unit according to claim 1, wherein the address data includes X and Y addresses of the memory cell array, and wherein the address decoder includes X and Y decoders for decoding the X and Y addresses, respectively.

15. A synchronous memory unit according to claim 2, wherein the address data includes X and Y addresses of the memory cell array, and wherein the address decoder includes X and Y decoders for decoding the X and Y addresses, respectively.

16. A synchronous memory unit according to claim 11, wherein the address data includes X and Y addresses of the memory cell array, and wherein the address decoder includes X and Y decoders for decoding the X and Y addresses, respectively.

17. A synchronous memory unit according to claim 1, wherein the address data includes X and Y addresses of the memory cell array, and wherein the address decoder includes X and Y decoders for respectively decoding the X and Y addresses, and a selector address decoder.

18. A synchronous memory unit according to claim 2, wherein the address data includes X and Y addresses of the memory cell array, and wherein the address decoder includes X and Y decoders for respectively decoding the X and Y addresses, and a selector address decoder.

19. A synchronous memory unit according to claim 4, wherein the address data includes X and Y addresses of the memory cell array, and wherein the address decoder includes X and Y decoders for respectively decoding the X and Y addresses, and a selector address decoder.

20. A synchronous memory according to claim 3, wherein the address data includes X and Y addresses of the memory cell array, wherein the precoder includes X and Y address predecoders for respectively predecoding the X and Y addresses, and wherein the address decoder includes X and Y decoders for respectively decoding the X and Y addresses.

21. A synchronous memory according to claim 5, wherein the address data includes X and Y addresses of the memory cell array, wherein the precoder includes X and Y address predecoders for respectively predecoding the X and Y addresses, and wherein the address decoder includes X and Y decoders for respectively decoding the X and Y addresses.

22. A synchronous memory according to claim 9, wherein the address data includes X and Y addresses of the memory cell array, wherein the precoder includes X and Y address predecoders for respectively predecoding the X and Y addresses, and wherein the address decoder includes X and Y decoders for respectively decoding the X and Y addresses.

23. A synchronous memory according to claim 10, wherein the address data includes X and Y addresses of the memory cell array, wherein the precoder includes X and Y address predecoders for respectively predecoding the X and Y addresses, and wherein the address decoder includes X and Y decoders for respectively decoding the X and Y addresses.

24. A synchronous memory according to claim 11, wherein the address data includes X and Y addresses of the memory cell array, wherein the precoder includes X and Y address predecoders for respectively predecoding the X and Y addresses, and wherein the address decoder includes X and Y decoders for respectively decoding the X and Y addresses.

25. A synchronous memory according to claim 12, wherein the address data includes X and Y addresses of the memory cell array, wherein the precoder includes X and Y address predecoders for respectively predecoding the X and Y addresses, and wherein the address decoder includes X and Y decoders for respectively decoding the X and Y addresses.

26. A synchronous memory according to claim 13, wherein the address data includes X and Y addresses of the memory cell array, wherein the precoder includes X and Y address predecoders for respectively predecoding the X and Y addresses, and wherein the address decoder includes X and Y decoders for respectively decoding the X and Y addresses.

27. A synchronous memory unit according to claim 14, further comprising:

a plurality of second input buffers for receiving write data;

a plurality of second input latches for taking in and outputting the write data held in the second input buffers by use of a clock signal;

a write circuit for writing the write data from the input latches to the memory cells of the memory cell array according to address data decoded by the decoders, a third input buffer for receiving a control signal' a third input latch for taking in and outputting the control signal held in the third input buffer by use of the clock signal; and a read/write control circuit for receiving the control signal from the third input latch and outputting signals for controlling the write circuit and the sense amplifier.

28. A synchronous memory unit according to claim 15, further comprising:

a plurality of second input buffers for receiving write data;

a plurality of second input latches for taking in and outputting the write data held in the second input buffers by use of a clock signal;

a write circuit for writing the write data from the input latches to the memory cells of the memory cell array according to address data decoded by the decoders, a third input buffer for receiving a control signal;

a third input latch for taking in and outputting the control signal held in the third input buffer by use of the clock signal; and a read/write control circuit for receiving the control signal from the third input latch and outputting signals for controlling the write circuit and the sense amplifier.

29. A synchronous memory unit according to claim 16, further comprising:

a plurality of second input buffers for receiving write data;

a plurality of second input latches for taking in and outputting the write data held in the second input buffers by use of a clock signal;

a write circuit for writing the write data from the input latches to the memory cells of the memory cell array according to address data decoded by the decoders, a third input buffer for receiving a control signal;

a third input latch for taking in and outputting the control signal held in the third input buffer by use of the clock signal; and a read/write control circuit for receiving the control signal from the third input latch and outputting signals for controlling the write circuit and the sense amplifier.

30. A synchronous memory unit according to claim 17, further comprising:

a plurality of second input buffers for receiving write data;

a plurality of second input latches for taking in and outputting the write data held in the second input buffers by use of a clock signal;

a write circuit for writing the write data from the input latches to the memory cells of the memory cell array according to address data decoded by the decoders, a third input buffer for receiving a control signal;

a third input latch for taking in and outputting the control signal held in the third input buffer by use of the clock signal; and a read/write control circuit for receiving the control signal from the third input latch and outputting signals for controlling the write circuit and the sense amplifier.

31. A synchronous memory unit according to claim 18, further comprising:

a plurality of second input buffers for receiving write data;

a plurality of second input latches for taking in and outputting the write data held in the second input buffers by use of a clock signal;

a write circuit for writing the write data from the input latches to the memory cells of the memory cell array according to address data decoded by the decoders, a third input buffer for receiving a control signal;

a third input latch for taking in and outputting the control signal held in the third input buffer by use of the clock signal; and a read/write control circuit for receiving the control signal from the third input latch and outputting signals for controlling the write circuit and the sense amplifier.

32. A synchronous memory circuit according to claim 20, further comprising:

a plurality of second input buffers for receiving write data;

a plurality of second input latches for taking in and outputting the write data held in the second input buffers by use of a clock signal;

a second selector address decoder for decoding the signal from the predecoders;

a write circuit for writing the write data from the input latch in the memory cells of the memory cell array in accordance with the second selector address decoder;

a third input buffer for receiving a control signal;

a third input latch for taking in and outputting the control signal held in the third input buffer by use of the clock signal; and a read/write control circuit for receiving the control signal from the third input latch and outputting signals for controlling the write circuit and the sense amplifier.

33. A synchronous memory circuit according to claim 21, further comprising:

a plurality of second input buffers for receiving write data;

a plurality of second input latches for taking in and outputting the write data held in the second input buffers by use of a clock signal;

a second selector address decoder for decoding the signal from the predecoders;

a write circuit for writing the write data from the input latch in the memory cells of the memory cell array in accordance with the second selector address decoder;

a third input buffer for receiving a control signal;

a third input latch for taking in and outputting the control signal held in the third input buffer by use of the clock signal; and a read/write control circuit for receiving the control signal from the third input latch and outputting signals for controlling the write circuit and the sense amplifier.

34. A synchronous memory circuit according to claim 22, further comprising:

a plurality of second input buffers for receiving write data;

a plurality of second input latches for taking in and outputting the write data held in the second input buffers by use of a clock signal;

a second selector address decoder for decoding the signal from the predecoders;

a write circuit for writing the write data from the input latch in the memory cells of the memory cell array in accordance with the second selector address decoder;

a third input buffer for receiving a control signal;

a third input latch for taking in and outputting the control signal held in the third input buffer by use of the clock signal; and a read/write control circuit for receiving the control signal from the third input latch and outputting signals for controlling the write circuit and the sense amplifier.

35. A synchronous memory circuit according to claim 23, further comprising:

a plurality of second input buffers for receiving write data;

a plurality of second input latches for taking in and outputting the write data held in the second input buffers by use of a clock signal;

a second selector address decoder for decoding the signal from the predecoders;

a write circuit for writing the write data from the input latch in the memory cells of the memory cell array in accordance with the second selector address decoder;

a third input buffer for receiving a control signal;

a third input latch for taking in and outputting the control signal held in the third input buffer by use of the clock signal; and a read/write control circuit for receiving the control signal from the third input latch and outputting signals for controlling the write circuit and the sense amplifier.

36. A synchronous memory circuit according to claim 24, further comprising:

a plurality of second input buffers for receiving write data;

a plurality of second input latches for taking in and outputting the write data held in the second input buffers by use of a clock signal;

a second selector address decoder for decoding the signal from the predecoders;

a write circuit for writing the write data from the input latch in the memory cells of the memory cell array in accordance with the second selector address decoder;

a third input buffer for receiving a control signal;

a third input latch for taking in and outputting the control signal held in the third input buffer by use of the clock signal; and a read/write control circuit for receiving the control signal from the third input latch and outputting signals for controlling the write circuit and the sense amplifier.

37. A synchronous memory circuit according to claim 25, further comprising:

a plurality of second input buffers for receiving write data;

a plurality of second input latches for taking in and outputting the write data held in the second input buffers by use of a clock signal;

a second selector address decoder for decoding the signal from the predecoders;

a write circuit for writing the write data from the input latch in the memory cells of the memory cell array in accordance with the second selector address decoder;

a third input buffer for receiving a control signal;

a third input latch for taking in and outputting the control signal held in the third input buffer by use of the clock signal; and a read/write control circuit for receiving the control signal from the third input latch and outputting signals for controlling the write circuit and the sense amplifier.

38. A synchronous memory circuit according to claim 26, further comprising:

a plurality of second input buffers for receiving write data;

a plurality of second input latches for taking in and outputting the write data held in the second input buffers by use of a clock signal;

a second selector address decoder for decoding the signal from the predecoders;

a write circuit for writing the write data from the input latch in the memory cells of the memory cell array in accordance with the second selector address decoder;

a third input buffer for receiving a control signal;

a third input latch for taking in and outputting the control signal held in the third input buffer by use of the clock signal; and a read/write control circuit for receiving the control signal from the third input latch and outputting signals for controlling the write circuit and the sense amplifier.

* * * * *